(12) United States Patent
Lee et al.

(10) Patent No.: US 12,550,374 B2
(45) Date of Patent: Feb. 10, 2026

(54) SEMICONDUCTOR DEVICE AND FORMATION METHOD THEREOF

(71) Applicant: TAIWAN SEMICONDUCTOR MANUFACTURING COMPANY, LTD., Hsinchu (TW)

(72) Inventors: Hsin-Yi Lee, Hsinchu (TW); Shan-Mei Liao, Hsinchu (TW); Kuo-Feng Yu, Hsinchu County (TW); Da-Yuan Lee, Hsinchu County (TW); Weng Chang, Hsinchu (TW); Chi On Chui, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 640 days.

(21) Appl. No.: 17/857,541

(22) Filed: Jul. 5, 2022

(65) Prior Publication Data

US 2024/0014279 A1 Jan. 11, 2024

(51) Int. Cl.
| | |
|---|---|
| *H10D 30/67* | (2025.01) |
| *H01L 21/311* | (2006.01) |
| *H01L 21/324* | (2006.01) |
| *H10D 30/01* | (2025.01) |
| *H10D 30/62* | (2025.01) |
| *H10D 62/10* | (2025.01) |

(52) U.S. Cl.
CPC ... *H10D 30/6735* (2025.01); *H01L 21/31105* (2013.01); *H01L 21/324* (2013.01); *H10D 30/024* (2025.01); *H10D 30/6211* (2025.01); *H10D 30/6757* (2025.01); *H10D 62/121* (2025.01)

(58) Field of Classification Search
CPC ............ H10D 30/024; H10D 30/6211; H10D 30/6757; H10D 62/121; H10D 30/797; H10D 30/014; H10D 30/43; H10D 64/017; H10D 64/667; H10D 64/685; H10D 62/822; H10D 84/83; H10D 84/85; H10D 64/691; H10D 84/0144; H10D 84/0181; H10D 84/038; H10D 30/6735; B82Y 10/00; H01L 21/28185; H01L 21/32134; H01L 21/3115; H01L 21/31105; H01L 21/324
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |

(Continued)

*Primary Examiner* — Victor A Mandala
(74) *Attorney, Agent, or Firm* — Birch, Stewart, Kolasch & Birch, LLP

(57) ABSTRACT

A method of forming a semiconductor device includes forming a fin over a substrate, the fin comprising alternately stacking first semiconductor layers and second semiconductor layers, removing the first semiconductor layers to form spaces each between the second semiconductor layers, forming a gate dielectric layer wrapping around each of the second semiconductor layers, forming a fluorine-containing layer on the gate dielectric layer, performing an anneal process to drive fluorine atoms from the fluorine-containing layer into the gate dielectric layer, removing the fluorine-containing layer, and forming a metal gate on the gate dielectric layer.

20 Claims, 41 Drawing Sheets

(56) References Cited

U.S. PATENT DOCUMENTS

| | | | |
|---|---|---|---|
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,854,459 B2* | 12/2020 | Wei | H10D 64/667 |
| 2005/0136579 A1* | 6/2005 | Hao | H01L 21/265 |
| | | | 257/E21.639 |
| 2019/0096680 A1* | 3/2019 | Wei | H10D 64/667 |
| 2019/0096681 A1* | 3/2019 | Wei | H01L 21/32134 |
| 2019/0139759 A1* | 5/2019 | Cheng | H01L 21/28211 |
| 2021/0036127 A1* | 2/2021 | Lin | H10D 64/017 |
| 2021/0057550 A1* | 2/2021 | Cheng | H10D 30/024 |
| 2021/0202327 A1* | 7/2021 | Wang | H10D 64/667 |
| 2022/0238686 A1* | 7/2022 | Lee | H01L 21/02603 |
| 2022/0351976 A1* | 11/2022 | Lee | H10D 64/017 |
| 2022/0352035 A1* | 11/2022 | Wang | H10D 30/62 |
| 2023/0009485 A1* | 1/2023 | Lee | H01L 21/324 |
| 2023/0068458 A1* | 3/2023 | Hsieh | H10D 30/6757 |
| 2023/0120117 A1* | 4/2023 | Hsu | H10D 30/031 |
| | | | 257/288 |
| 2023/0207663 A1* | 6/2023 | Lee | H01L 21/28185 |
| | | | 257/288 |
| 2023/0317523 A1* | 10/2023 | Lai | H10D 84/0158 |
| | | | 257/401 |
| 2024/0153823 A1* | 5/2024 | Lai | H10D 64/667 |

\* cited by examiner

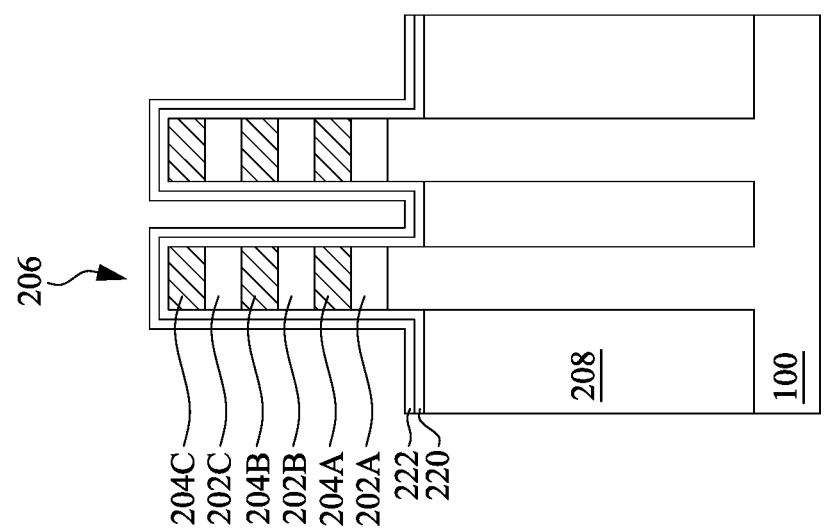

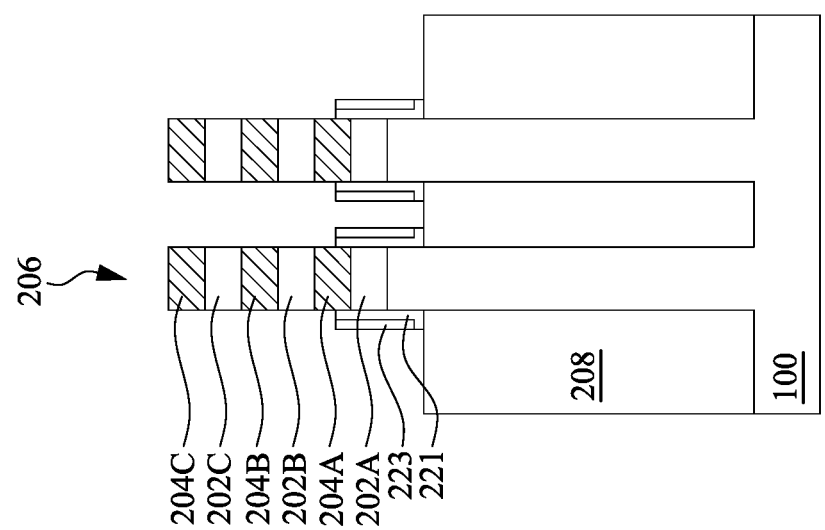

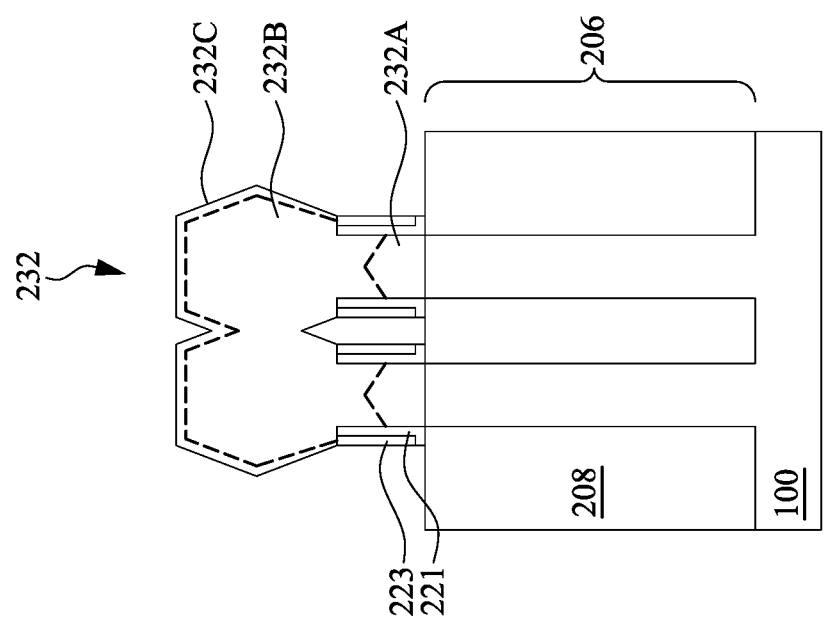

SEMICONDUCTOR DEVICE AND FORMATION METHOD THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A, 8A, 9A, 10A, 11A, 12A, and 13C are cross-sectional views at intermediate fabrication stages, illustrating reference cross-section C-C' illustrated in FIG. 1 that extends through source/drain regions along the longitudinal direction of the gate region.

DETAILED DESCRIPTION

Figure 1:
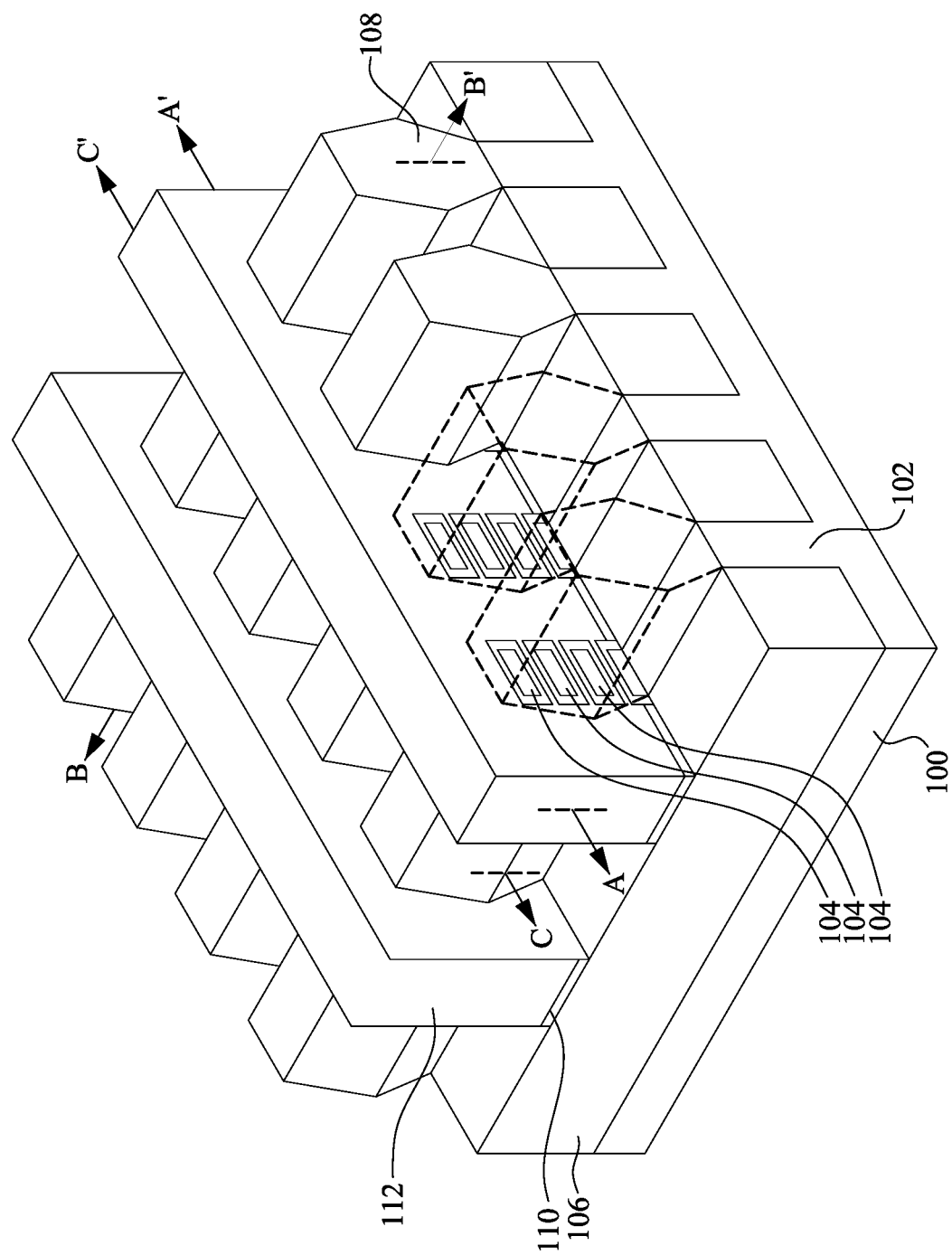
FIG. 1 illustrates an example of gate-all-around field-effect transistors (GAA-FETs) in a three-dimensional view, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 230 degrees or at other orientations) and the spatially relative descriptors used herein may likewise be interpreted accordingly. As used herein, "around," "about," "approximately," or "substantially" may generally mean within 20 percent, or within 10 percent, or within 5 percent of a given value or range. Numerical quantities given herein are approximate, meaning that the term "around," "about," "approximately," or "substantially" can be inferred if not expressly stated.

In the present disclosure, a method for fabricating a gate dielectric layer wrapping around the channels, in which the gate dielectric layer includes fluorine atoms, for a GAA FET and a stacked channel FET are provided. In this disclosure, a source/drain refers to a source and/or a drain. It is noted that in the present disclosure, a source and a drain are interchangeably used and the structures thereof are substantially the same.

In the foregoing process, however, it is difficult to precisely control the fluorine atoms in the gate dielectric layer in different device regions. Since the fluorine atoms can influence the threshold voltage of the device, it is difficult to precisely control the threshold voltage of devices with different types. In view of this, the present disclosure provides a method for fabricating a gate dielectric layer free from fluorine atoms in a first device region and including fluorine atoms in a second device region, which can tune the threshold voltage more precisely for devices with different types.

The present disclosure is generally related to integrated circuit (IC) structures and methods of forming the same, and more particularly to fabricating gate-all-around (GAA) transistors having gate dielectric layer free from fluorine atoms in a first device region and including fluorine atoms in a second device region. It is also noted that the present disclosure presents embodiments in the form of multi-gate transistors. Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheet) or any number of channels. One of ordinary skill may recognize other examples of semiconductor devices that may benefit from aspects of the present disclosure.

FIG. 1 illustrates an example of GAA-FETs (e.g., nanowire FETs, nanosheet FETs, or the like) in a three-dimensional view, in accordance with some embodiments. The GAA-FETs comprise nanostructures 104 (e.g., nanosheets, nanowires, nanorings, nanoslabs, or other structures having nanoscale size (e.g., a few nanometers)) over fins 102 on a substrate 100 (e.g., a semiconductor substrate), wherein the nanostructures 104 act as channel regions for the GAA-FETs. The nanostructure 104 may include p-type nanostructures, n-type nanostructures, or a combination thereof. Isolation regions 106 are disposed between adjacent fins 102, which may protrude above and from between neighboring isolation regions 106. Although the isolation regions 106 are described/illustrated as being separate from the substrate 100, as used herein, the term "substrate" may refer to the semiconductor substrate alone or a combination of the semiconductor substrate and the isolation regions. Additionally, although a bottom portion of the fins 102 are illustrated as being single, continuous materials with the substrate 100, the bottom portion of the fins 102 and/or the substrate 100 may comprise a single material or a plurality of materials. In this context, the fins 102 refer to the portion extending between the neighboring isolation regions 106.

Gate dielectrics 110 are over top surfaces of the fins 102 and along top surfaces, sidewalls, and bottom surfaces of the nanostructures 104. Gate electrodes 112 are over the gate dielectrics 110. Epitaxial source/drain regions 108 are disposed on the fins 102 on opposing sides of the gate dielectrics 110 and the gate electrodes 112.

FIG. 1 further illustrates reference cross-sections that are used in later figures. Cross-section A-A' is along a longitudinal axis of a gate electrode 112 and in a direction, for example, perpendicular to the direction of current flow between the epitaxial source/drain regions 108 of a GAA-FET. Cross-section B-B' is perpendicular to cross-section A-A' and is parallel to a longitudinal axis of a fin 102 of the GAA-FET and in a direction of, for example, a current flow between the epitaxial source/drain regions 108 of the GAA-FET. Cross-section C-C' is parallel to cross-section A-A' and extends through epitaxial source/drain regions of the GAA-FETs. Subsequent figures refer to these reference cross-sections for clarity.

Some embodiments discussed herein are discussed in the context of GAA-FETs formed using a gate-last process. In other embodiments, a gate-first process may be used. Also, some embodiments contemplate aspects used in planar devices, such as planar FETs or in fin field-effect transistors (FinFETs).

FIGS. 2 through 5, 6A, 13A, 14A, and 15A illustrate reference cross-section A-A' illustrated in FIG. 1 that extends through a gate region along a longitudinal axis of the gate region. FIGS. 6B, 7B, 8B, 9B, 10B, 11B, 12B, 13B, 14B, and 15B illustrate reference cross-section B-B' illustrated in FIG. 1 that extends through a fin along a longitudinal axis of the fin. FIGS. 7A, 8A, 9A, 10A, 11A, 12A, and 13C illustrate reference cross-section C-C' illustrated in FIG. 1 that extends through source/drain regions along the longitudinal direction of the gate region. FIGS. 16, 17, 18, 19, 20A, 21A, and 21B are cross-sectional views at intermediate fabrication stages, illustrating reference cross-section A-A' illustrated in FIG. 1 that extends through a gate region along a longitudinal axis of the gate region. FIG. 22 is a graph illustrating a fluorine concentration in the high-k gate dielectric layer, the interfacial layer and the nanostructure in accordance with some embodiments. FIGS. 23, 24, 25, 26, 27 and 28 are cross-sectional views at intermediate fabrication stages, illustrating reference cross-section A-A' illustrated in FIG. 1 that extends through a gate region along a longitudinal axis of the gate region.

Figure 2:
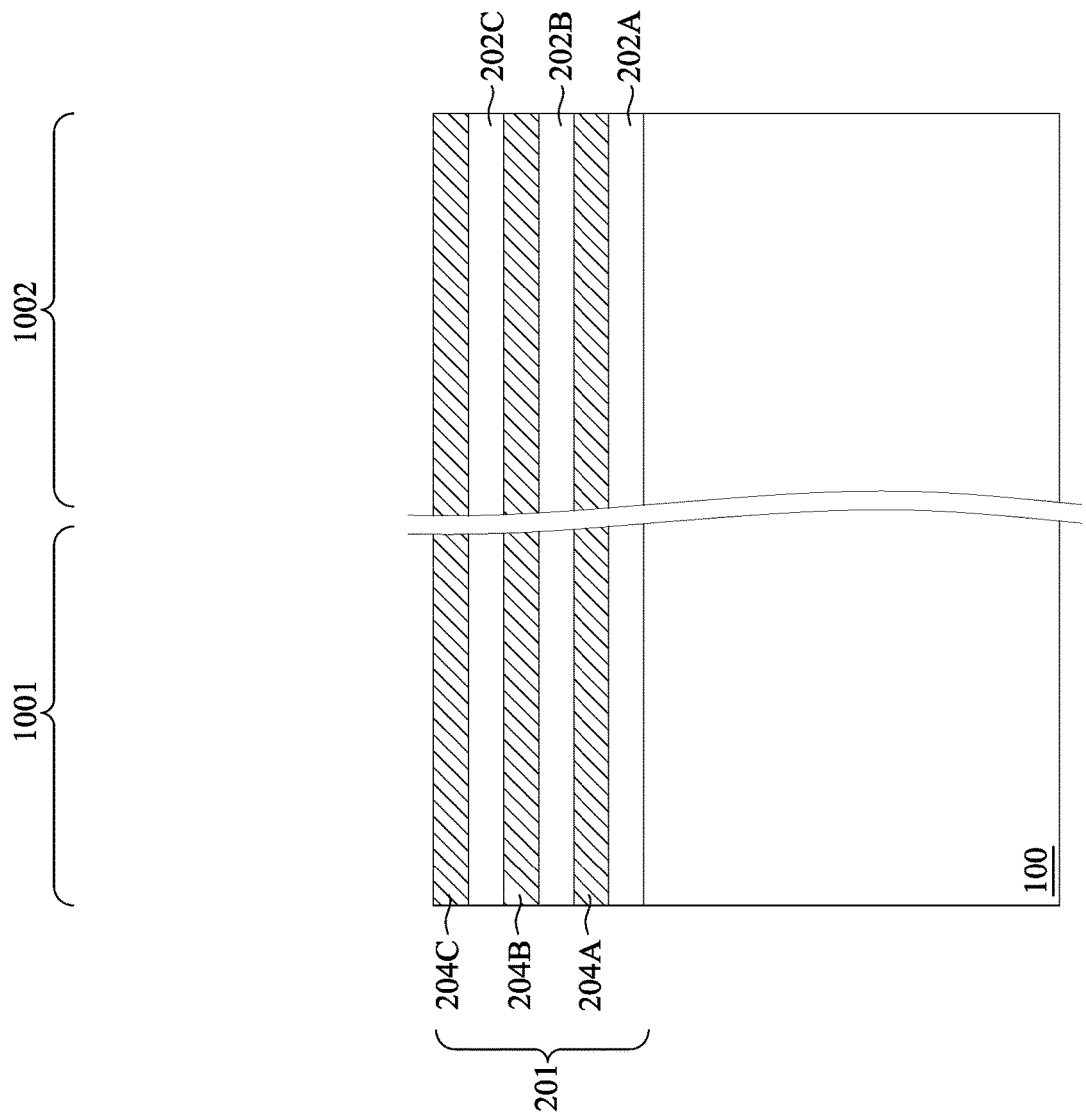
FIGS. 2-5, 6A, 13A, 14A, 15A are cross-sectional views at intermediate fabrication stages, illustrating reference cross-section A-A' illustrated in FIG. 1 that extends through a gate region along a longitudinal axis of the gate region.

In FIG. 2, a substrate 100 is provided. The substrate 100 may be a semiconductor substrate, such as a bulk semiconductor, a semiconductor-on-insulator (SOI) substrate, or the like, which may be doped (e.g., with a p-type or an n-type dopant) or undoped. The substrate 100 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 100 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 100 has a first device region 1001 and a second device region 1002. The first device region 1001 is a region in which first transistors will reside, and the second device region 1002 is a region in which second transistors will reside. In some embodiments, the first transistors are different from the second transistors at least in threshold voltage. For example, first transistors in the first device region 1001 may be HV devices (e.g., I/O devices), and second transistors in the second device region 1002 may be LV devices (e.g., logic devices). In some other embodiments, the first transistors are different from the second transistors at least in conductivity type. For example, first device region 1001 can be for forming n-type devices, such as NMOS transistors, e.g., n-type GAA-FETs, and the second device region 1002 can be for forming p-type devices, such as PMOS transistors, e.g., p-type GAA-FETs.

The first device region 1001 may be separated from the second device region 1002, and any number of device features (e.g., other active devices, doped regions, isolation structures, etc.) may be disposed between the first device region 1001 and the second device region 1002. Although one first device region 1001 and one second device region 1002 are illustrated, any number of first device regions 1001 and second device regions 1002 may be provided.

Further in FIG. 2, a multi-layer stack 201 is formed over the substrate 100. The multi-layer stack 201 includes alternating layers of first semiconductor layers 202A-C (collectively referred to as first semiconductor layers 202) and second semiconductor layers 204A-C (collectively referred to as second semiconductor layers 204). For purposes of illustration and as discussed in greater detail below, the first semiconductor layers 202 will be removed and the second semiconductor layers 204 will be patterned to form channel regions of GAA-FETs.

The multi-layer stack 201 is illustrated as including three layers of each of the first semiconductor layers 202 and the second semiconductor layers 204 for illustrative purposes. In some embodiments, the multi-layer stack 201 may include any number of the first semiconductor layers 202 and the second semiconductor layers 204. Each of the layers of the multi-layer stack 201 may be epitaxially grown using a process such as chemical vapor deposition (CVD), atomic layer deposition (ALD), vapor phase epitaxy (VPE), molecular beam epitaxy (MBE), or the like. In various embodiments, the second semiconductor layers 204 may be formed of a semiconductor material suitable for serving as channel regions of GAA-FETs, such as silicon, silicon carbon, silicon germanium, or the like.

The first semiconductor materials and the second semiconductor materials may be materials having a high-etch selectivity to one another. As such, the first semiconductor layers 202 of the first semiconductor material may be removed without significantly removing the second semiconductor layers 204 of the second semiconductor material, thereby allowing the second semiconductor layers 204 to serve as channel regions of GAA-FETs.

Figure 3:
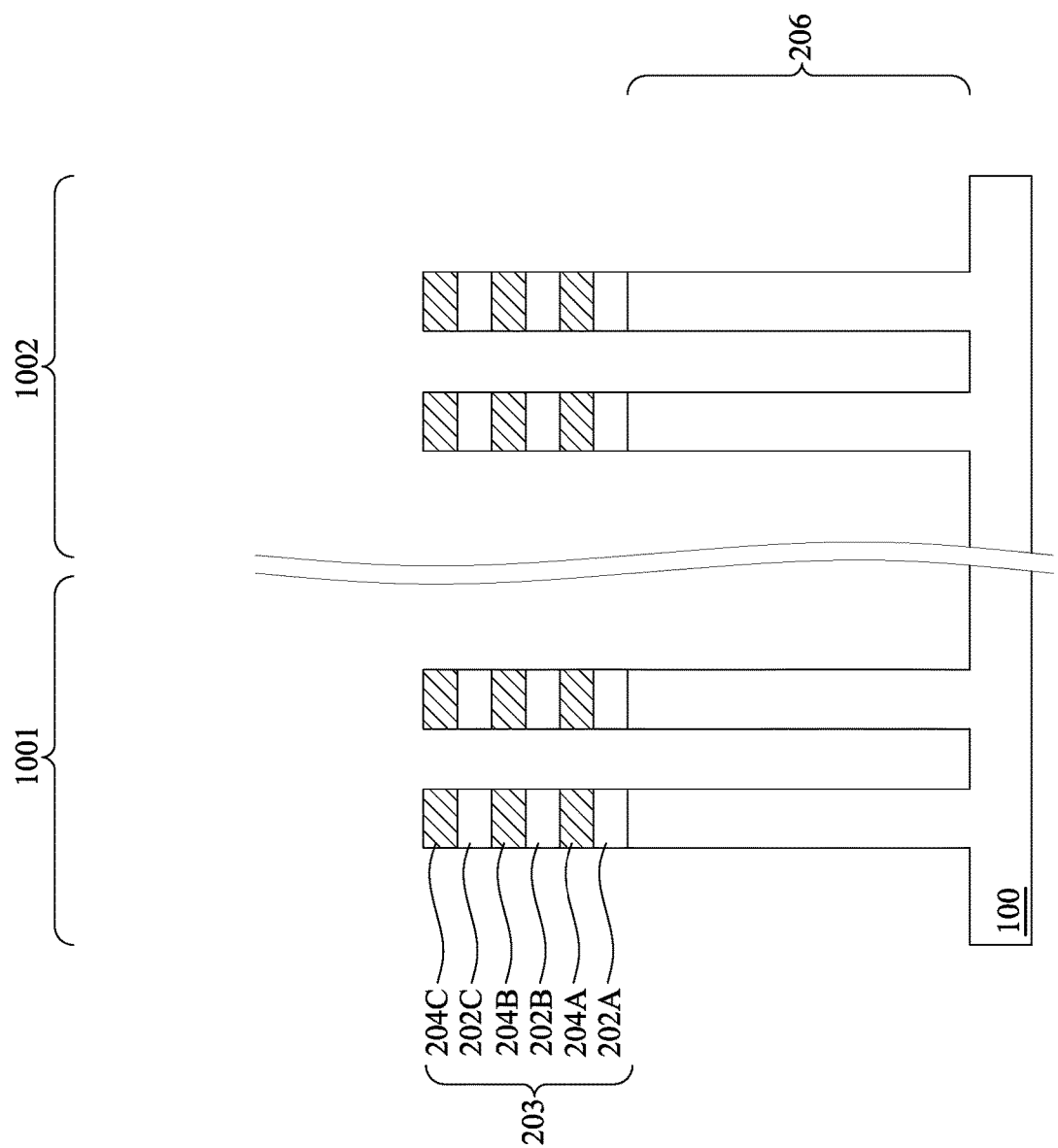

Referring now to FIG. 3, fin structures 206 are formed in the substrate 100 and nanostructures 203 are formed in the multi-layer stack 201, in accordance with some embodiments. In some embodiments, the nanostructures 203 and the fin structures 206 may be formed in the multi-layer stack 201 and the substrate 100, respectively, by etching trenches in the multi-layer stack 201 and the substrate 100. Each fin structure 206 and overlying nanostructures 203 can be collectively referred to as a fin extending from the substrate 100. The etching may be any acceptable etch process, such as a reactive ion etch (RIE), neutral beam etch (NBE), the like, or a combination thereof. The etching may be anisotropic. Forming the nanostructures 203 by etching the multi-layer stack 201 may further define first nanostructures 202A-C (collectively referred to as the first nanostructures 202) from the first semiconductor layers 202 and define second nanostructures 204A-C (collectively referred to as the second nanostructures 204) from the second semiconductor layers 204. The first nanostructures 202 and the second nanostructures 204 may further be collectively referred to as nanostructures 203.

The fin structures 206 and the nanostructures 203 may be patterned by any suitable method. For example, the fin structures 206 and the nanostructures 203 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fin structures 206.

FIG. 3 illustrates the fin structures 206 in the first device region 1001 and the second device region 1002 as having substantially equal widths for illustrative purposes. In some embodiments, widths of the fin structures 206 in the first device region 1001 may be greater or thinner than the fin structures 206 in the second device region 1002. Further, while each of the fin structures 206 and the nanostructures 203 are illustrated as having a consistent width throughout, in other embodiments, the fin structures 206 and/or the nanostructures 203 may have tapered sidewalls such that a width of each of the fin structures 206 and/or the nanostructures 203 continuously increases in a direction towards the substrate 100. In such embodiments, each of the nanostructures 203 may have a different width and be trapezoidal in shape.

Figure 4:
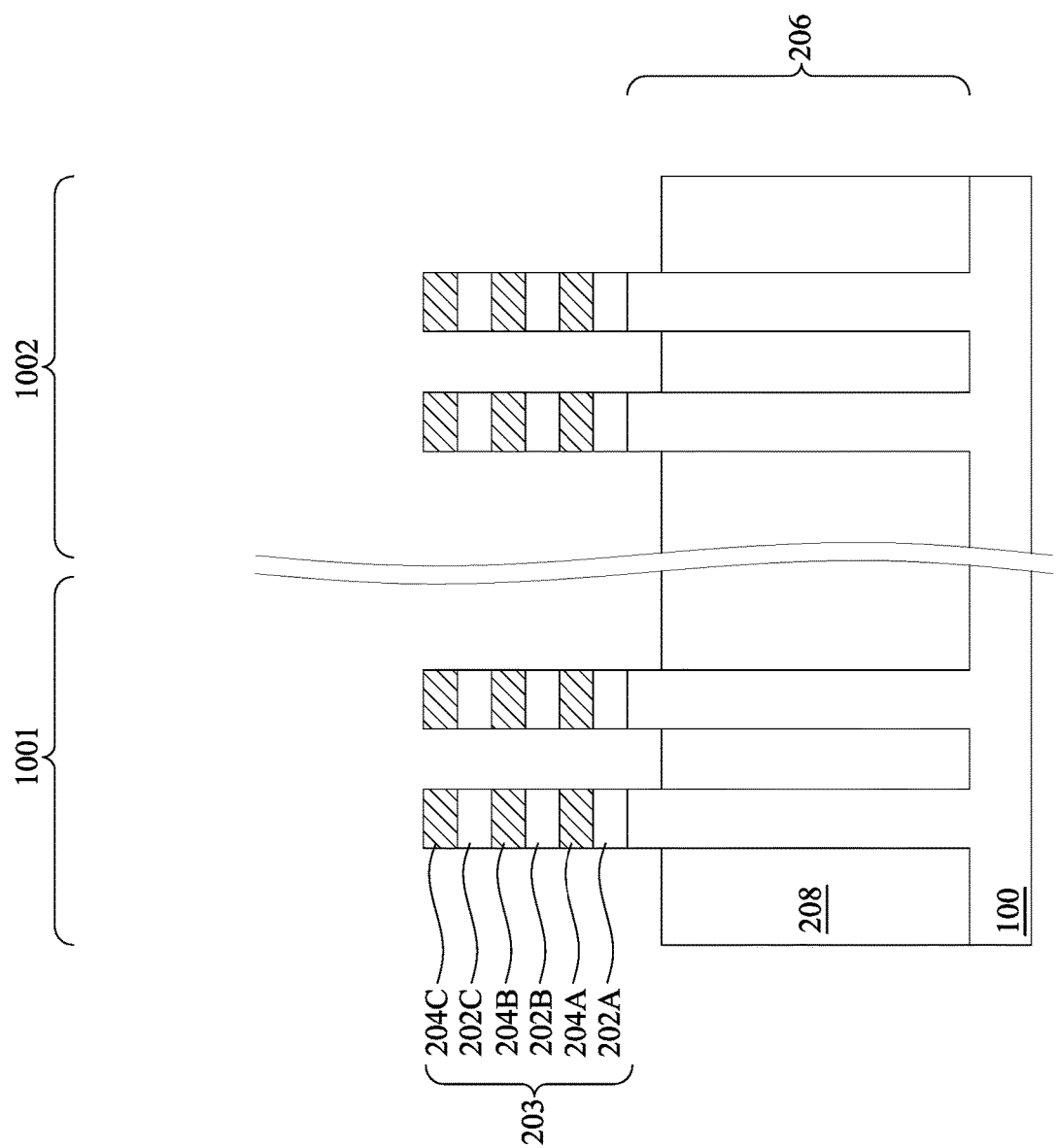

In FIG. 4, shallow trench isolation (STI) regions 208 are formed adjacent the fin structures 206. The STI regions 208 may be formed by depositing an insulation material over the substrate 100, the fin structures 206, and nanostructures 203, and between adjacent fin structures 206. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 203. Although the insulation material is illustrated as a single layer, some embodiments may utilize multiple layers. For example, in some embodiments a liner (not separately illustrated) may first be formed along a surface of the substrate 100, the fin structures 206, and the nanostructures 203. Thereafter, a fill material, such as those discussed above may be formed over the liner.

A removal process is then applied to the insulation material to remove excess insulation material over the nanostructures 203. In some embodiments, a planarization process such as a chemical mechanical polish (CMP), an etch-back process, combinations thereof, or the like may be utilized. The planarization process exposes the nanostructures 203 such that top surfaces of the nanostructures 203 and the insulation material are level after the planarization process is complete.

The insulation material is then recessed to form the STI regions 208. The insulation material is recessed such that upper portions of fin structures 206 in the first and second device regions 1001 and 1002 and protrude from between neighboring STI regions 208. Further, the top surfaces of the STI regions 208 may have a flat surface as illustrated, a convex surface, a concave surface (such as dishing), or a combination thereof. The top surfaces of the STI regions 208 may be formed flat, convex, and/or concave by an appropriate etch. The STI regions 208 may be recessed using an acceptable etching process, such as one that is selective to the material of the insulation material (e.g., etches the material of the insulation material at a faster rate than the material of the fin structures 206 and the nanostructures 203). For example, an oxide removal using, for example, dilute hydrofluoric (dHF) acid may be used.

The process described above with respect to FIGS. 2 through 4 is just one example of how the fin structures 206 and the nanostructures 203 may be formed. In some embodiments, the fin structures 206 and/or the nanostructures 203 may be formed using a mask and an epitaxial growth process. For example, a dielectric layer can be formed over a top surface of the substrate 100, and trenches can be etched through the dielectric layer to expose the underlying substrate 100. Epitaxial structures can be epitaxially grown in the trenches, and the dielectric layer can be recessed such that the epitaxial structures protrude from the dielectric layer to form the fin structures 206 and/or the nanostructures 203. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers (and resulting nanostructures 202) and the second semiconductor layers (and resulting nanostructures 204) are illustrated and discussed herein as comprising the same materials in the second device region 1002 and the first device region 1001 for illustrative purposes only. As such, in some embodiments one or both of the first semiconductor layers and the second semiconductor layers may be different materials or formed in a different order in the first and second device regions 1001 and 1002.

Further in FIG. 4, appropriate wells (not separately illustrated) may be formed in the fin structures 206, the nanostructures 203, and/or the STI regions 208. In some embodiments with different well types in different device regions 1001 and 1002, different implant steps for the first device region 1001 and the second device region 1002 may be achieved using a photoresist or other masks (not separately illustrated). For example, a photoresist may be formed over the fin structures 206 and the STI regions 208 in the first device region 1001 and the second device region 1002. The photoresist is patterned to expose the second device region 1002. The photoresist can be formed by using a spin-on technique and can be patterned using acceptable photolithography techniques. Once the photoresist is patterned, a first impurity (e.g., n-type impurity such as phosphorus, arsenic, antimony, or the like) implant is performed in the second device region 1002, and the photoresist may act as a mask to substantially prevent the first impurities from being implanted into the first device region 1001. After the implant, the photoresist is removed, such as by an acceptable ashing process.

Following or prior to the implanting of the second device region 1002, a photoresist or other masks (not separately illustrated) is formed over the fin structures 206, the nanostructures 203, and the STI regions 208 in the first device region 1001 and the second device region 1002. The photoresist is then patterned to expose the first device region 1001. The photoresist can be formed by using a spin-on technique and can be patterned using acceptable photolithography techniques. Once the photoresist is patterned, a second impurity (e.g., p-type impurity such as boron, boron fluoride, indium, or the like) implant may be performed in the first device region 1001, and the photoresist may act as a mask to substantially prevent p-type impurities from being implanted into the second device region 1002. After the implant, the photoresist may be removed, such as by an acceptable ashing process.

After one or more well implants of the first device region 1001 and the second device region 1002, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 5:
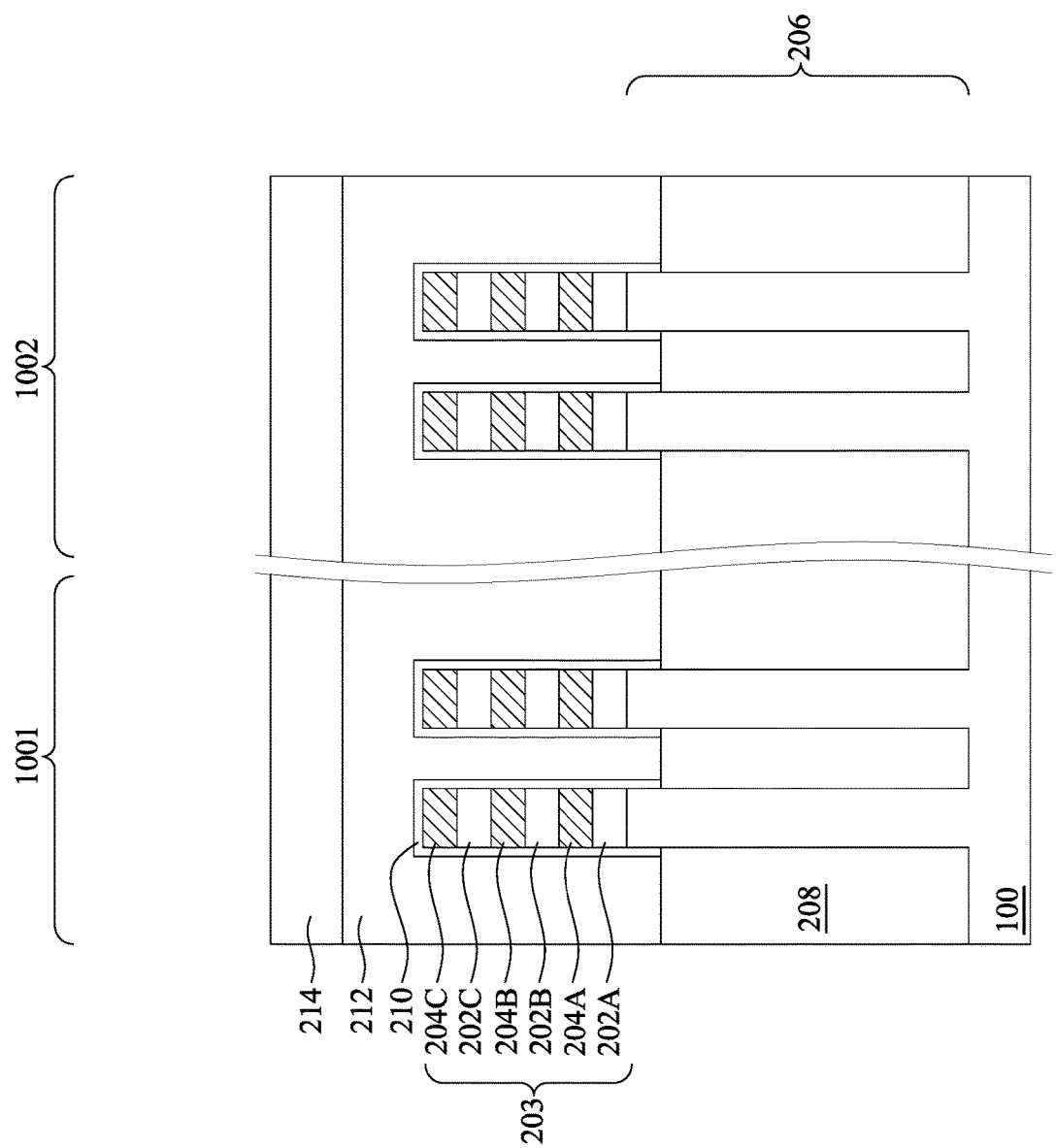

In FIG. 5, a dummy dielectric layer 210 is formed on the fin structures 206 and/or the nanostructures 203. The dummy dielectric layer 210 may be, for example, silicon oxide, silicon nitride, a combination thereof, or the like, and may be deposited or thermally grown according to acceptable techniques. A dummy gate layer 212 is formed over the dummy dielectric layer 210, and a mask layer 214 is formed over the dummy gate layer 212. The dummy gate layer 212 may be deposited over the dummy dielectric layer 210 and then planarized, such as by a CMP. The mask layer 214 may be deposited over the dummy gate layer 212. The dummy gate layer 212 may be a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The dummy gate layer 212 may be deposited by physical vapor deposition (PVD), CVD, sputter deposition, or other techniques for depositing the selected material. The dummy gate layer 212 may be made of other materials that have a high etching selectivity from the etching of isolation regions. The mask layer 214 may include, for example, silicon nitride, silicon oxynitride, or the like. In this example, a single dummy gate layer 212 and a single mask layer 214 are formed across the first device region 1001 and the second device region 1002. It is noted that the dummy dielectric layer 210 is shown covering only the fin structures 206 and the nanostructures 203 for illustrative purposes only. In some embodiments, the dummy dielectric layer 210 may be deposited such that the dummy dielectric layer 210 covers the STI regions 208, such that the dummy dielectric layer 210 extends between the dummy gate layer 212 and the STI regions 208.

Figure 6A:
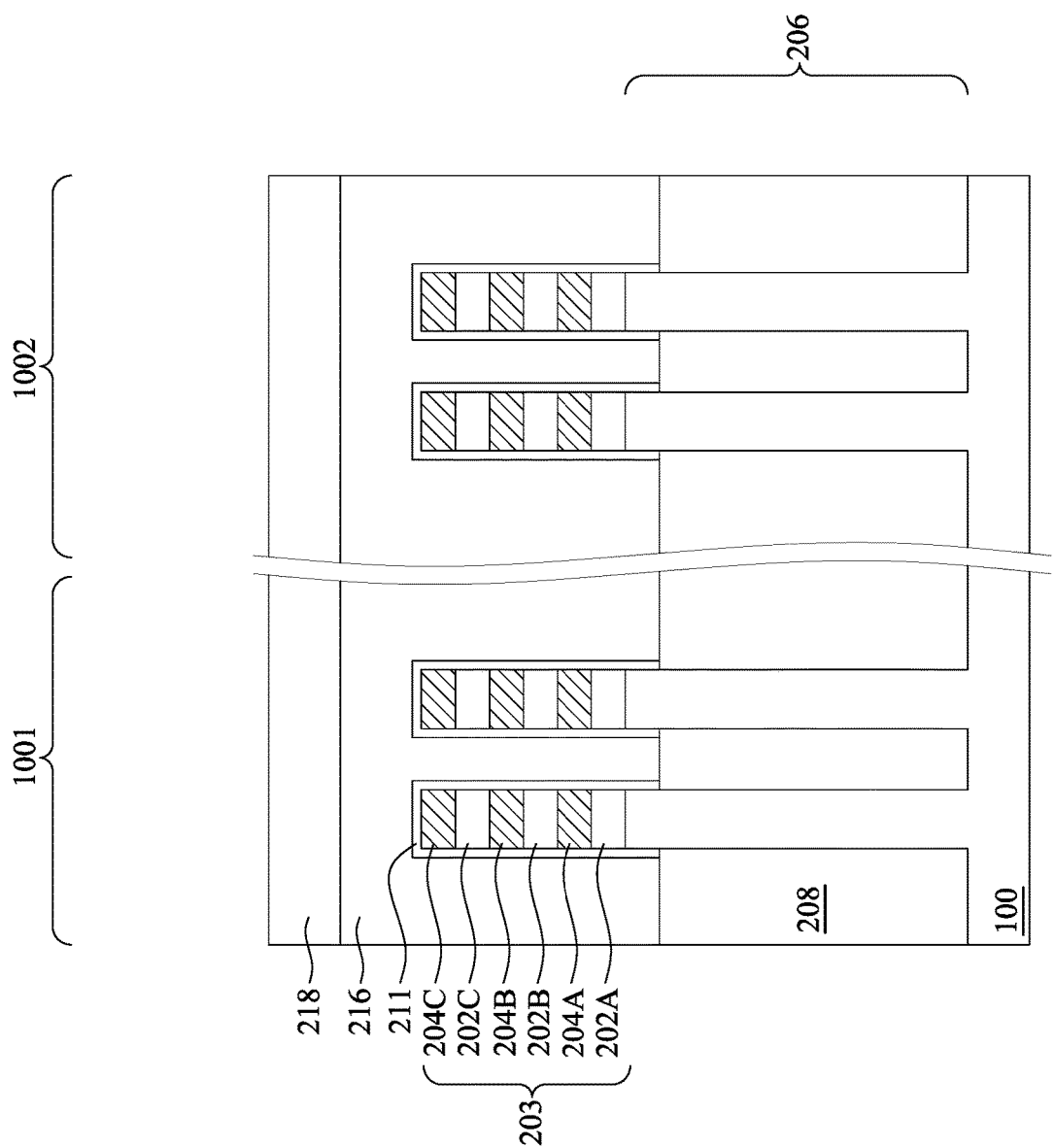
Figure 6B:
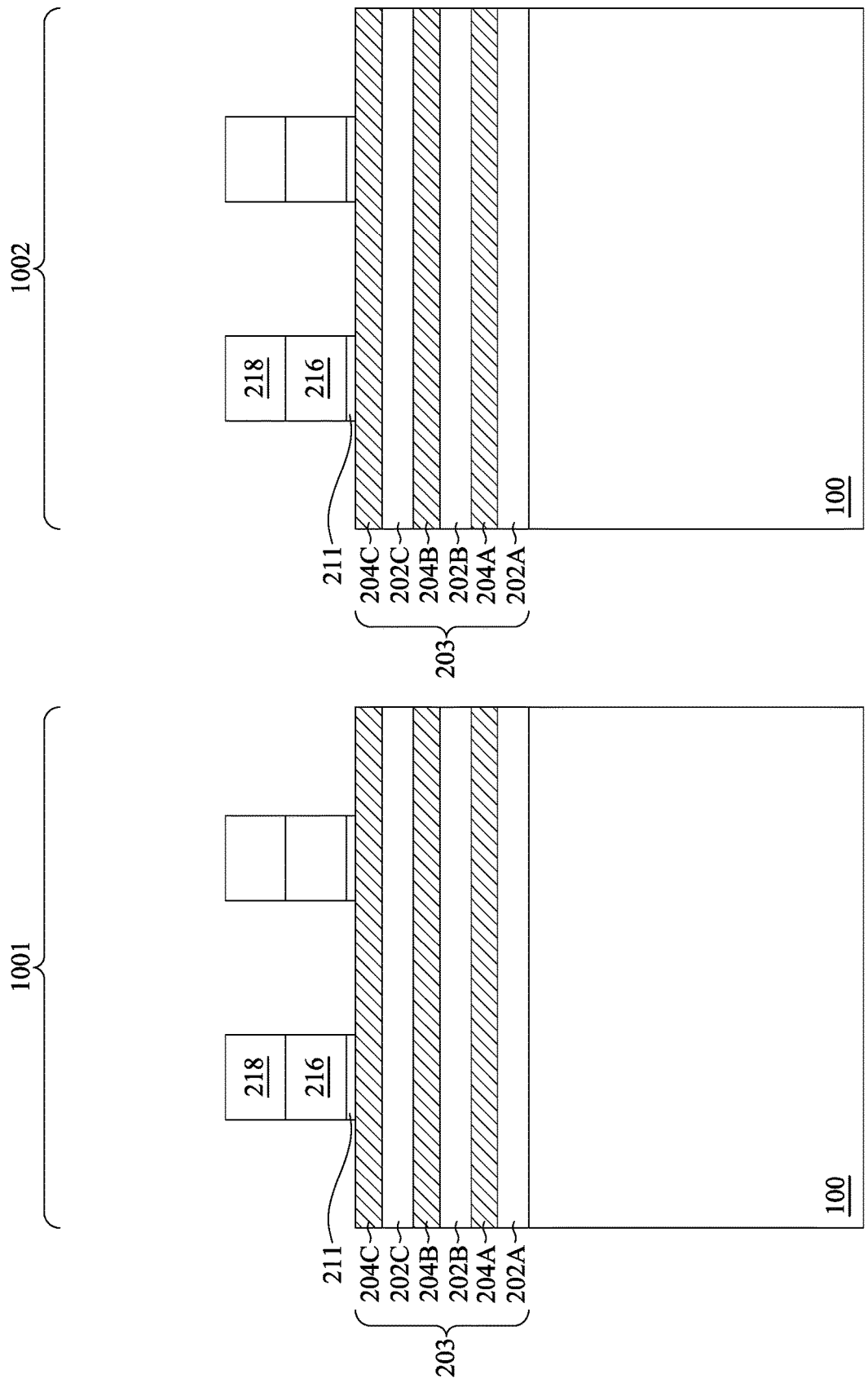
FIGS. 6B, 7B, 8B, 9B, 10B, 11B, 12B, 13B, 14B, 15B are cross-sectional views at intermediate fabrication stages, illustrating reference cross-section B-B' illustrated in FIG. 1 that extends through a fin along a longitudinal axis of the fin.

FIGS. 6A through 24 illustrate various following steps in the manufacturing of embodiment devices. FIGS. 6A, 7A, 8A, 9A, 10A, 11A, 12A, 13A, 13C, 14A, and 15A illustrate features in either the first device regions 1001 or the second device regions 1002. In FIGS. 6A and 6B, the mask layer 214 (see FIG. 5) may be patterned using acceptable photolithography and etching techniques to form masks 218. The pattern of the masks 218 then may be transferred to the dummy gate layer 212 and to the dummy dielectric layer 210 to form dummy gates 216 and dummy gate dielectrics 211, respectively. The dummy gates 216 cover respective channel regions of the fin structures 206. The pattern of the masks 218 may be used to physically separate each of the dummy gates 216 from adjacent dummy gates 216. The dummy gates 216 may also have a lengthwise direction substantially perpendicular to the lengthwise direction of respective fin structures 206.

Figure 7B:
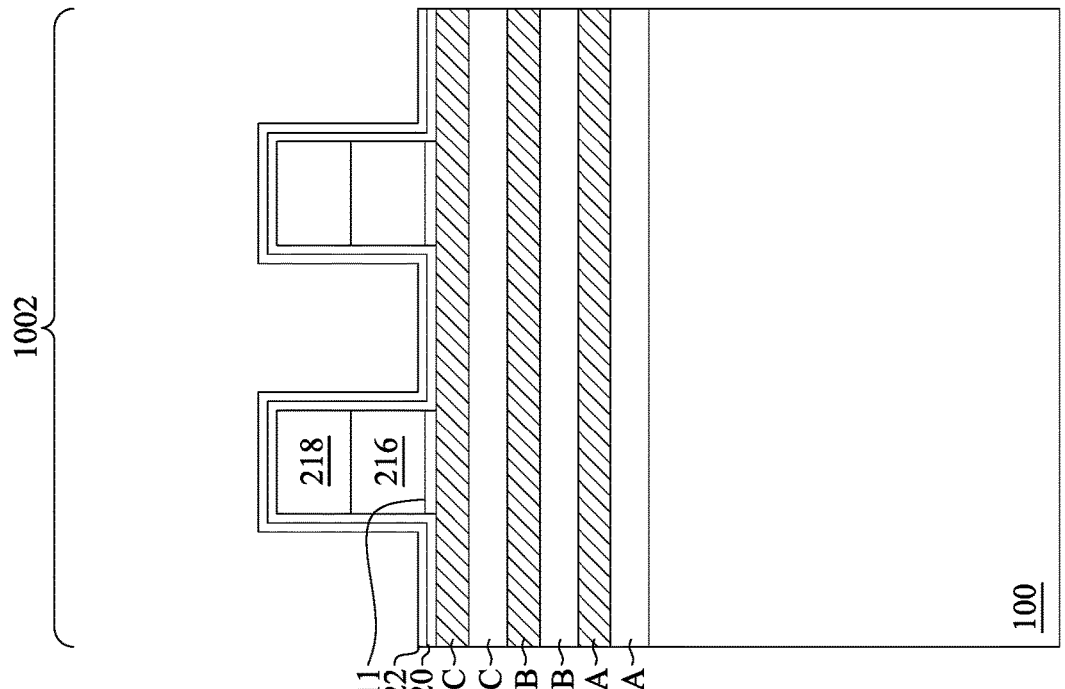
Figure 7B:
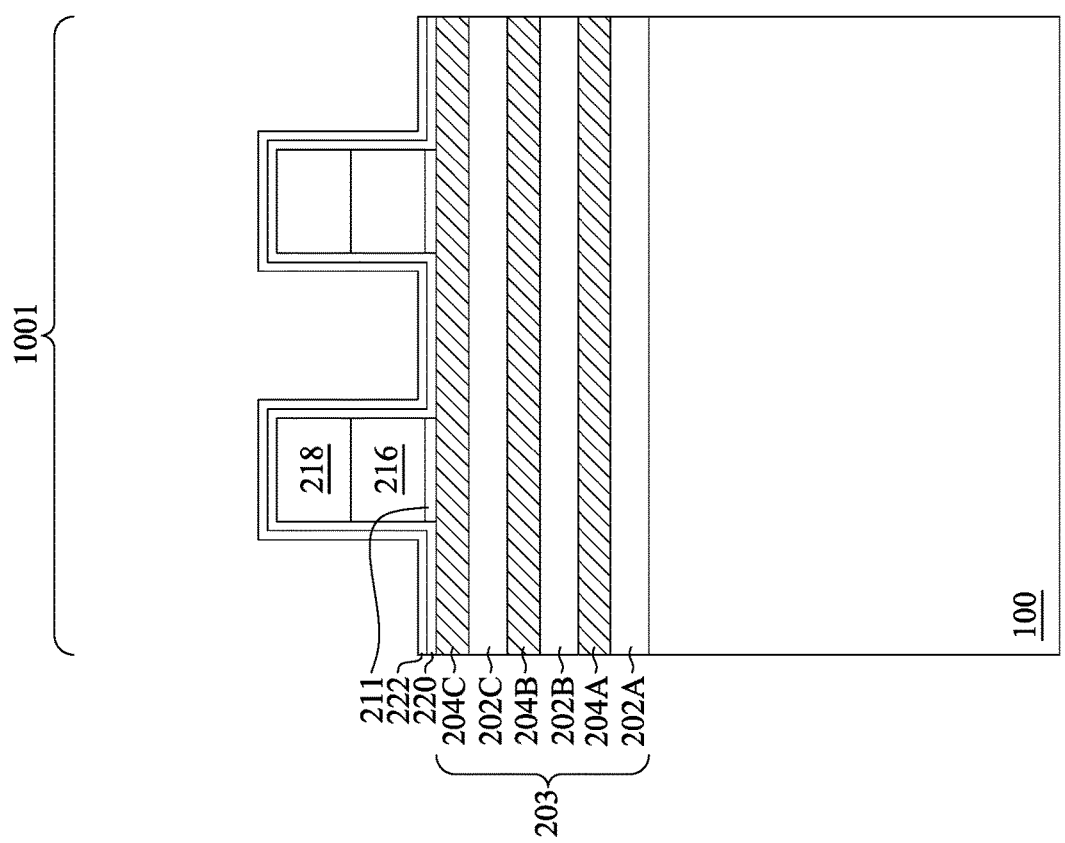

In FIGS. 7A and 7B, a first spacer layer 220 and a second spacer layer 222 are formed over the structures illustrated in FIGS. 6A and 6B, respectively. The first spacer layer 220 and the second spacer layer 222 will be subsequently patterned to act as spacers for forming self-aligned source/drain regions. In FIGS. 7A and 7B, the first spacer layer 220 is formed on top surfaces of the STI regions 208; top surfaces and sidewalk of the fin structures 206, the nanostructures 203, and the masks 218; and sidewalls of the dummy gates 216 and the dummy gate dielectric 211. The second spacer layer 222 is deposited over the first spacer layer 220. The first spacer layer 220 may be formed of silicon oxide, silicon nitride, silicon oxynitride, or the like, using techniques such as thermal oxidation or deposited by CVD, ALD, or the like. The second spacer layer 222 may be formed of a material having a different etch rate than the material of the first spacer layer 220, such as silicon oxide, silicon nitride, silicon oxynitride, or the like, and may be deposited by CVD, ALD, or the like.

Figure 8B:
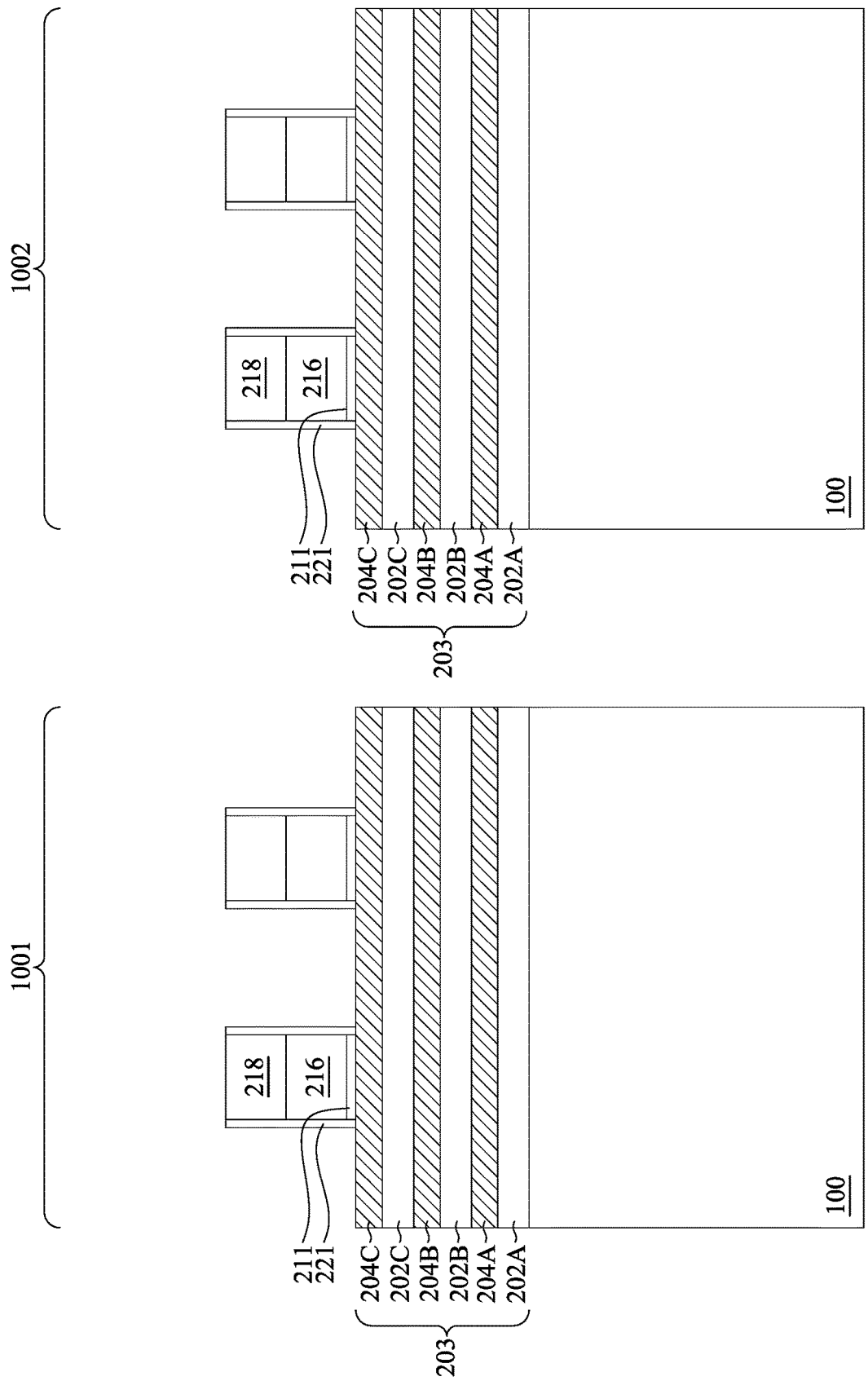

In FIGS. 8A and 8B, the first spacer layer 220 and the second spacer layer 222 are etched to form first spacers 221 and second spacers 223. As will be discussed in greater detail below, the first spacers 221 and the second spacers 223 act to self-align subsequently formed source drain regions, as well as to protect sidewalls of the fin structures 206 and/or nanostructure 203 during subsequent processing. The first spacer layer 220 and the second spacer layer 222 may be etched using a suitable etching process, such as an isotropic etching process (e.g., a wet etching process), an anisotropic etching process (e.g., a dry etching process), or the like. In some embodiments, the material of the second spacer layer 222 has a different etch rate than the material of the first spacer layer 220, such that the first spacer layer 220 may act as an etch stop layer when patterning the second spacer layer 222 and such that the second spacer layer 222 may act as a mask when patterning the first spacer layer 220. For example, the second spacer layer 222 may be etched using an anisotropic etch process wherein the first spacer layer 220 acts as an etch stop layer, wherein remaining portions of the second spacer layer 222 form second spacers 223 as illustrated in FIG. 8A. Thereafter, the second spacers 223 acts as a mask while etching exposed portions of the first spacer layer 220, thereby forming first spacers 221 as illustrated in FIG. 8A.

As illustrated in FIG. 8A, the first spacers 221 and the second spacers 223 are disposed on sidewalls of the fin structures 206 and/or nanostructures 203. In some embodiments, the spacers 221 and 223 only partially remain on sidewalls of the fin structures 206. In some embodiments, no spacer remains on sidewalls of the fin structures 206. As illustrated in FIG. 8B, in some embodiments, the second spacer layer 222 may be removed from over the first spacer layer 220 adjacent the masks 218, the dummy gates 216, and the dummy gate dielectrics 211, and the first spacers 221 are disposed on sidewalls of the masks 218, the dummy gates 216, and the dummy gate dielectrics 211. In other embodiments, a portion of the second spacer layer 222 may remain over the first spacer layer 220 adjacent the masks 218, the dummy gates 216, and the dummy gate dielectrics 211.

The above disclosure generally describes a process of forming spacers. Other processes and sequences may be used. For example, fewer or additional spacers may be utilized, different sequence of steps may be utilized (e.g., the first spacers 221 may be patterned prior to depositing the second spacer layer 222), additional spacers may be formed and removed, and/or the like. Furthermore, devices in first device region 1001 and devices in the second device region 1002 may be formed using different structures and steps.

Figure 9A:
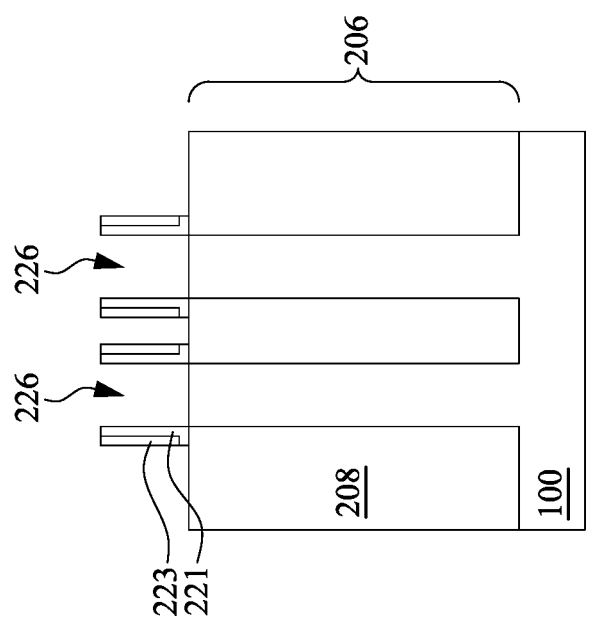
Figure 9B:
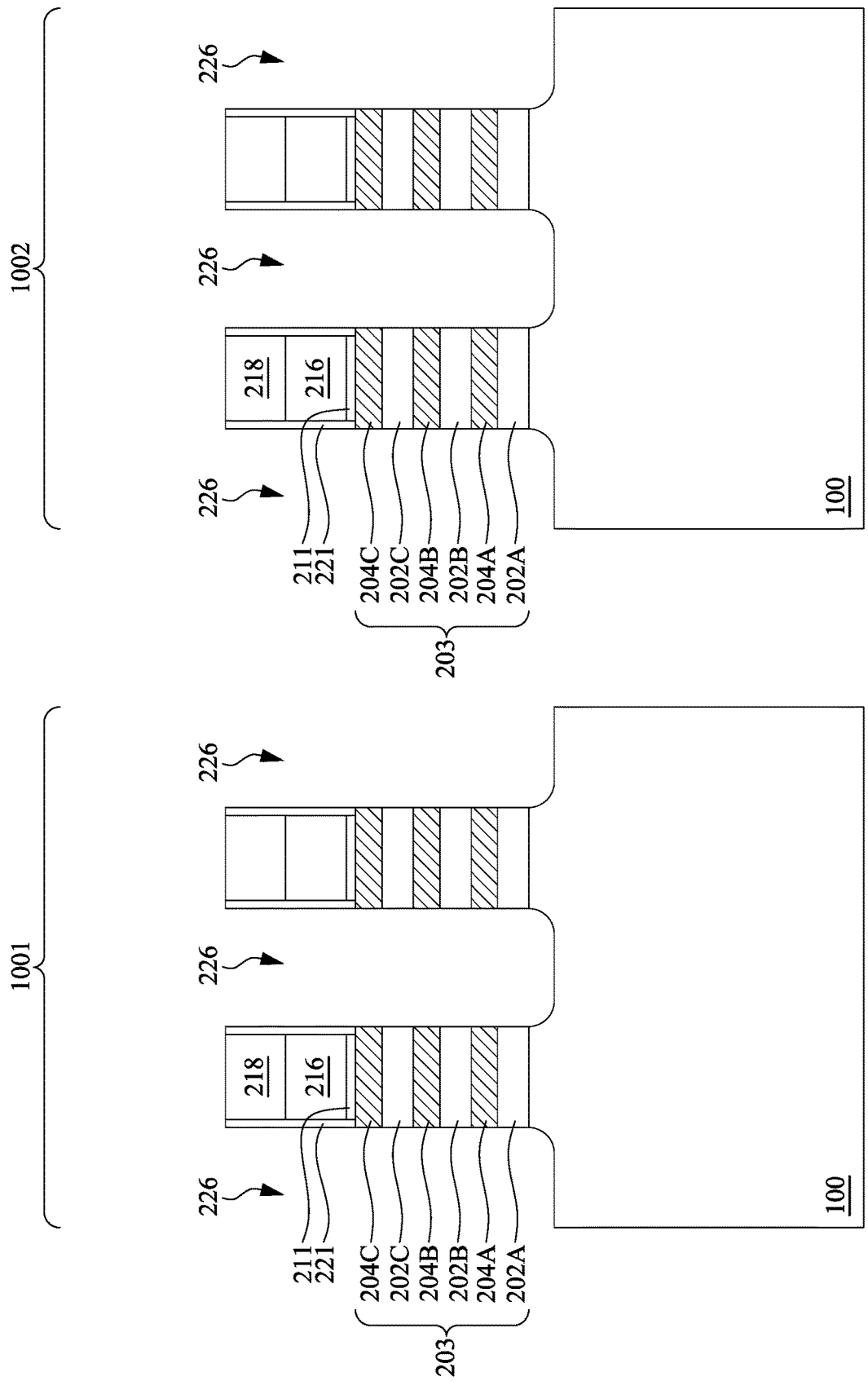

In FIGS. 9A and 9B, source/drain recesses 226 are formed in the fin structures 206, the nanostructures 203, and the substrate 100, in accordance with some embodiments. Epitaxial source/drain regions will be subsequently formed in the source/drain recesses 226. The source/drain recesses 226 may extend through the first nanostructures 202 and the second nanostructures 204, and into the substrate 100. As illustrated in FIG. 9A, bottom surfaces of the source/drain recesses 226 may be level with top surfaces of the STI regions 58, as an example. In some other embodiments, the fin structures 206 may be etched such that bottom surfaces of the source/drain recesses 226 are disposed below the top surfaces of the STI regions 208, or above the top surfaces of the STI regions 208. The source/drain recesses 226 may be formed by etching the fin structures 206, the nanostructures 203, and the substrate 100 using anisotropic etching processes, such as RIE, NBE, or the like. The first spacers 221, the second spacers 223, and the masks 218 mask portions of the fin structures 206, the nanostructures 203, and the substrate 100 during the etching processes used to form the source/drain recesses 226. A single etch process or multiple etch processes may be used to etch each layer of the nanostructures 203 and/or the fin structures 206. Timed etch processes may be used to stop the etching of the source/drain recesses 226 after the source/drain recesses 226 reach a target depth.

Figure 10A:
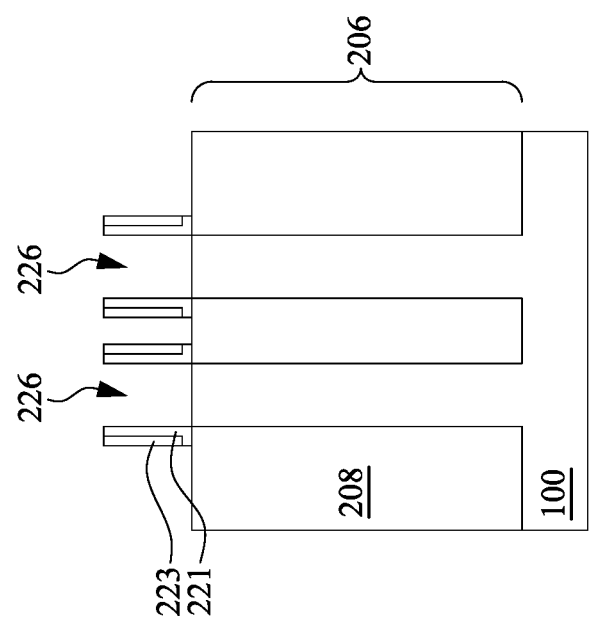
Figure 10B:
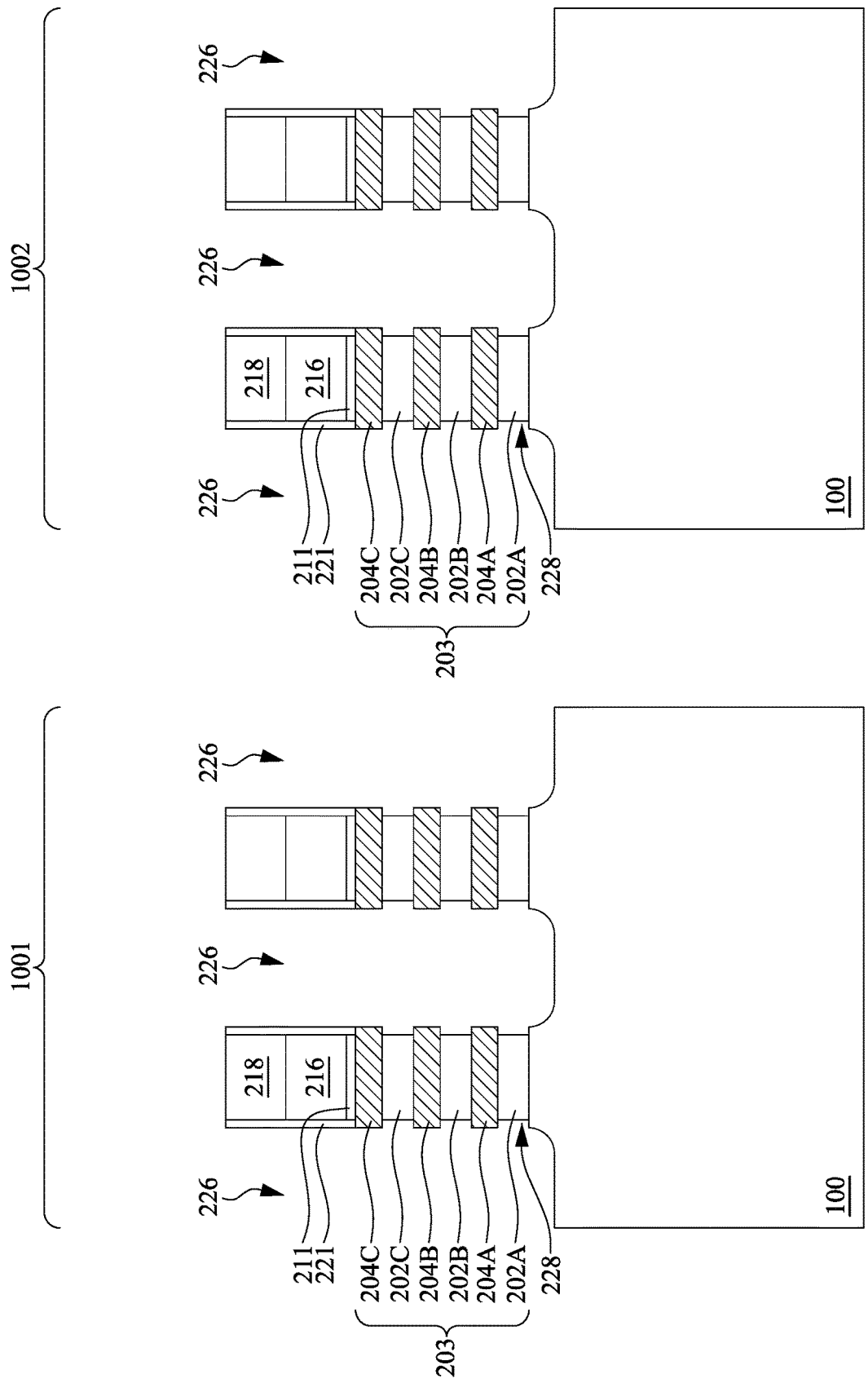

In FIGS. 10A and 10B, portions of sidewalls of the layers of the multi-layer stack 201 formed of the first semiconductor materials (e.g., the first nanostructures 202) exposed by the source/drain recesses 226 are etched to form sidewall recesses 228 between corresponding second nanostructures 204. Although sidewalls of the first nanostructures 202 in the sidewall recesses 228 are illustrated as being straight in FIG. 10B, the sidewalls may be concave or convex. The sidewalls may be etched using isotropic etching processes, such as wet etching or the like. In some embodiments in which the first nanostructures 202 include, e.g., SiGe, and the second nanostructures 204 include, e.g., Si or SiC, a dry etch process with tetramethylammonium hydroxide (TMAH), ammonium hydroxide ($NH_4OH$), or the like may be used to etch sidewalls of the first nanostructures 202.

Figure 11A:
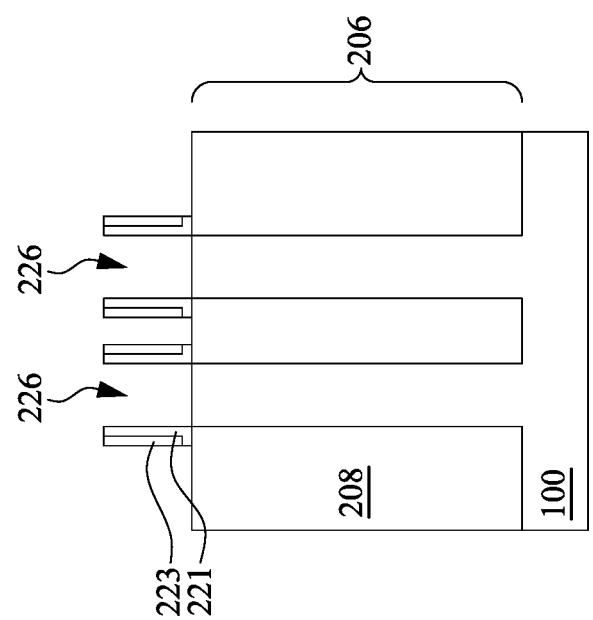
Figure 11B:
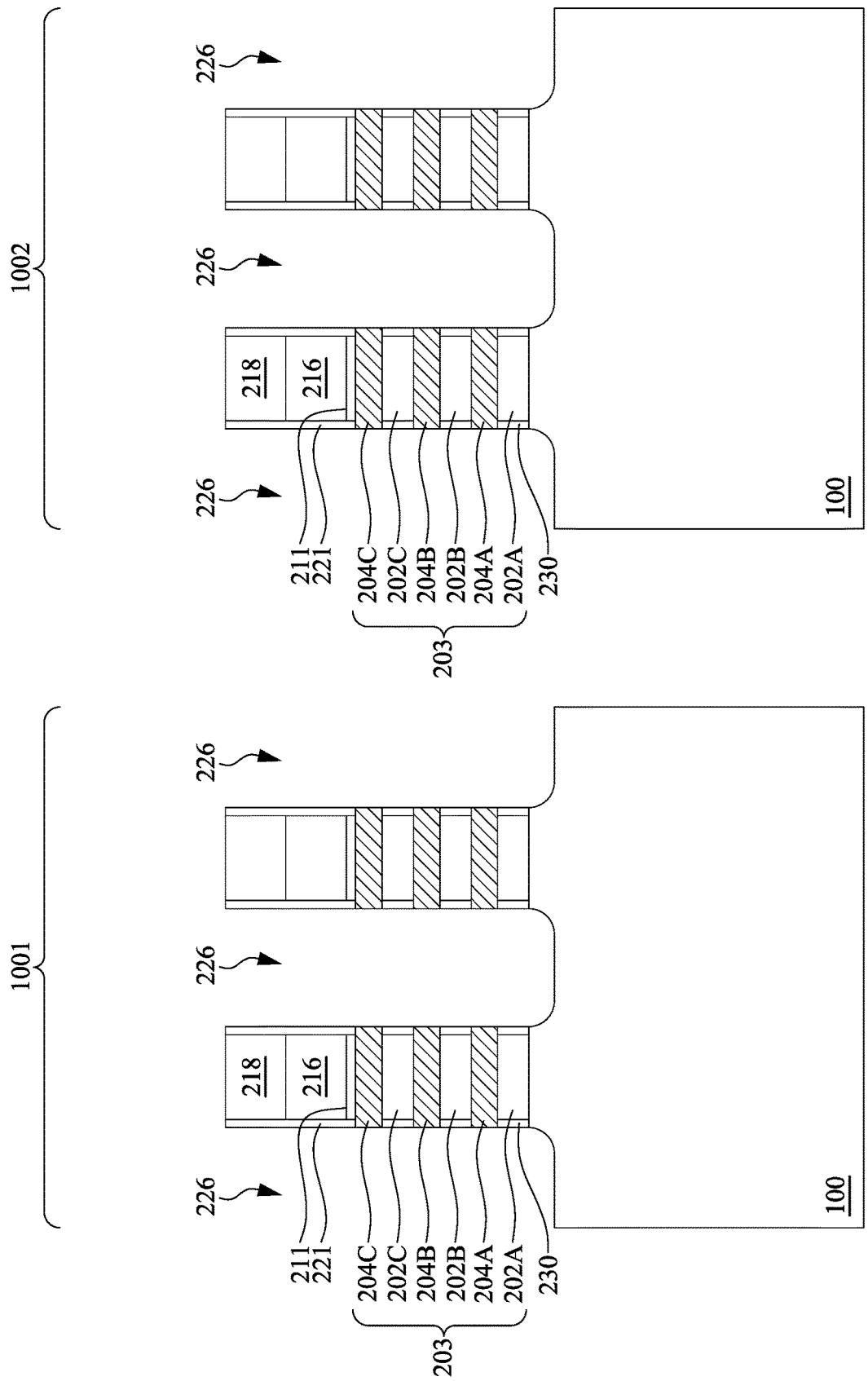

In FIGS. 11A-11B, inner spacers 230 are formed in the sidewall recess 228. The inner spacers 230 may be formed by depositing an inner spacer layer (not separately illustrated) over the structures illustrated in FIGS. 10A and 10B. The inner spacers 230 act as isolation features between subsequently formed source/drain regions and gate structure. As will be discussed in greater detail below, source/drain regions will be formed in the recesses 226, and the first nanostructures 202 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the inner spacers 230. Although outer sidewalls of the inner spacers 230 are illustrated as being flush with sidewalls of the second nanostructures 204, the outer sidewalls of the inner spacers 230 may extend beyond or be recessed from sidewalls of the second nanostructures 204.

Moreover, although the outer sidewalls of the inner spacers 230 are illustrated as being straight in FIG. 11B, the outer sidewalls of the inner spacers 230 may be concave or convex. The inner spacer layer may be etched by an anisotropic etching process, such as RIE, NBE, or the like. The inner spacers 230 may be used to prevent damage to subsequently formed source/drain regions (such as the epitaxial source/drain regions 232, discussed below with respect to FIGS. 12A-12B) by subsequent etching processes, such as etching processes used to form gate structures.

Figure 12B:
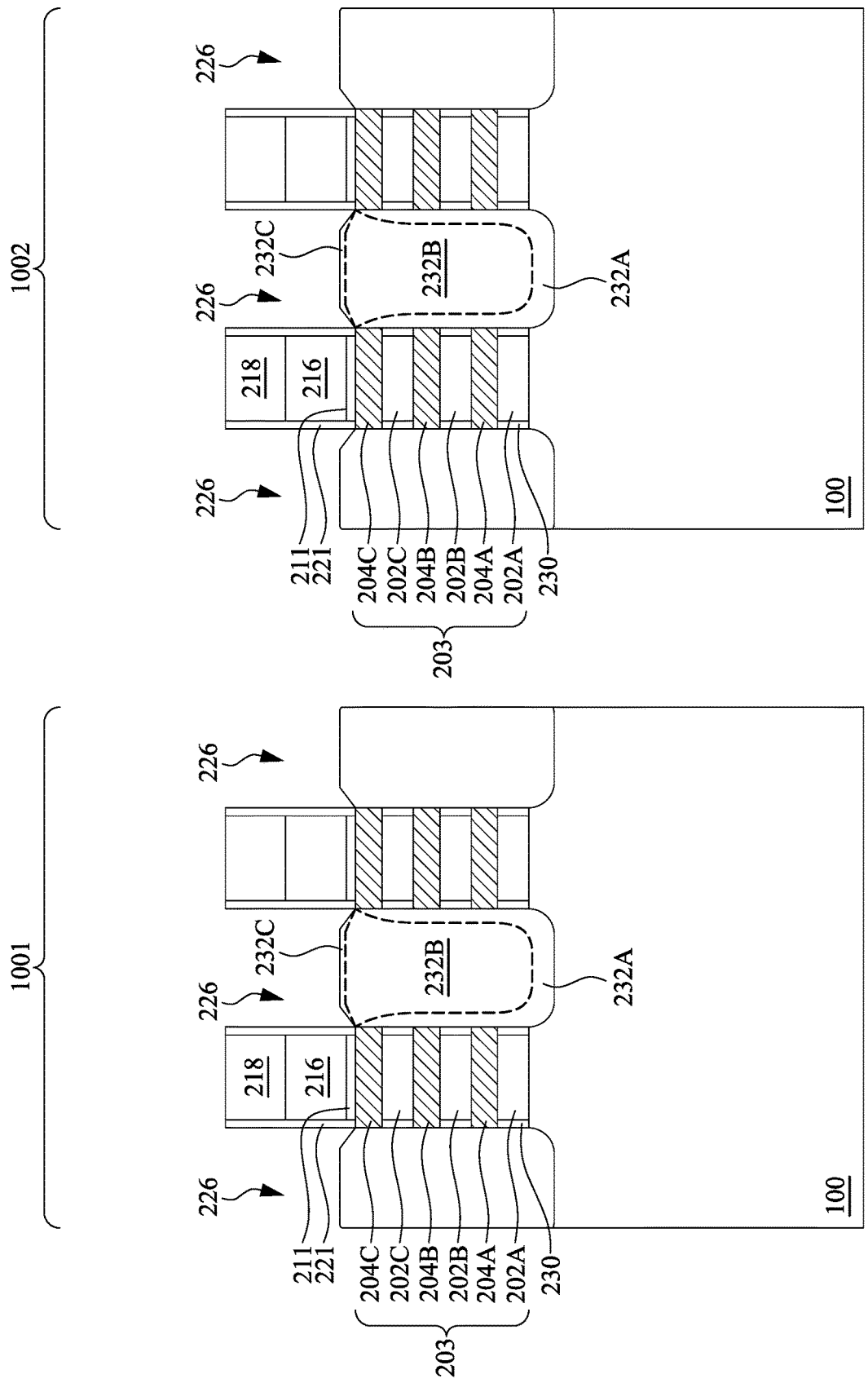

In FIGS. 12A-12B, epitaxial source/drain regions 232 are formed in the source/drain recesses 226. In some embodiments, the epitaxial source/drain regions 232 may exert stress on the second nanostructures 204, thereby improving device performance. As illustrated in FIG. 12B, the epitaxial source/drain regions 232 are formed in the source/drain recesses 226 such that each dummy gate 216 is disposed between respective neighboring pairs of the epitaxial source/drain regions 232. In some embodiments, the first spacers 221 are used to separate the epitaxial source/drain regions 232 from the dummy gates 216 and the inner spacers 230 are used to separate the epitaxial source/drain regions 232 from the first nanostructures 202 by an appropriate lateral distance so that the epitaxial source/drain regions 232 do not short out with subsequently formed gates of the resulting GAA-FETs.

In some embodiments, the epitaxial source/drain regions 232 may include any acceptable material appropriate for n-type GAA-FETs. For example, if the second nanostructures 204 are silicon, the epitaxial source/drain regions 232 may include materials exerting a tensile strain on the second nanostructures 204, such as silicon carbide, phosphorous doped silicon carbide, silicon phosphide, or the like. In some embodiments, the epitaxial source/drain regions 232 may include any acceptable material appropriate for p-type GAA-FETs. For example, if the second nanostructures 204 are silicon, the epitaxial source/drain regions 232 may comprise materials exerting a compressive strain on the second nanostructures 204, such as silicon germanium, boron doped silicon germanium, germanium, germanium tin, or the like. The epitaxial source/drain regions 232 may have surfaces raised from respective upper surfaces of the nanostructures 203 and may have facets.

The epitaxial source/drain regions 232 may be implanted with dopants to form source/drain regions, followed by an anneal. The n-type and/or p-type impurities for source/drain regions may be any of the impurities previously discussed. In some embodiments, the epitaxial source/drain regions 232 may be in situ doped during growth.

As a result of the epitaxy processes used to form the epitaxial source/drain regions 232, upper surfaces of the epitaxial source/drain regions 232 have facets which expand laterally outward beyond sidewalls of the nanostructures 203. In some embodiments, these facets cause adjacent epitaxial source/drain regions 232 to merge as illustrated by FIG. 12A. In some other embodiments, adjacent epitaxial source/drain regions 232 remain separated after the epitaxy process is completed. In the embodiments illustrated in FIG. 12A, the first spacers 221 may be formed to a top surface of the STI regions 208 thereby blocking the lateral epitaxial growth. In some other embodiments, the first spacers 221 may cover portions of the sidewalls of the nanostructures 203 further blocking the epitaxial growth. In some other embodiments, the spacer etch used to form the first spacers 221 may be adjusted to remove the spacer material to allow the epitaxially grown region to extend to the surface of the STI region 58.

The epitaxial source/drain regions 232 may comprise one or more semiconductor material layers. For example, the epitaxial source/drain regions 232 may comprise a first semiconductor material layer 232A, a second semiconductor material layer 232B, and a third semiconductor material layer 232C. Any number of semiconductor material layers may be used for the epitaxial source/drain regions 232. Each of the first semiconductor material layer 232A, the second semiconductor material layer 232B, and the third semiconductor material layer 232C may be formed of different semiconductor materials and may be doped to different dopant concentrations. In some embodiments, the first semiconductor material layer 232A may have a dopant concentration less than the second semiconductor material layer 232B and greater than the third semiconductor material layer 232C. In embodiments in which the epitaxial source/drain regions 232 comprise three semiconductor material layers, the first semiconductor material layer 232A may be deposited, the second semiconductor material layer 232B may be deposited over the first semiconductor material layer 232A, and the third semiconductor material layer 232C may be deposited over the second semiconductor material layer 232B.

Figure 13A:
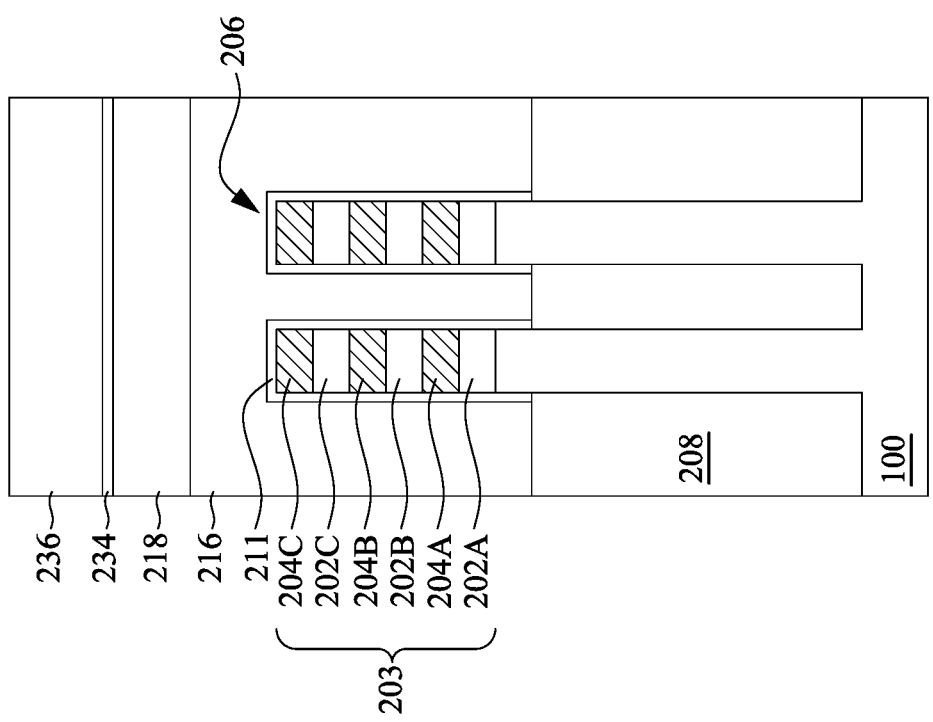
Figure 13B:
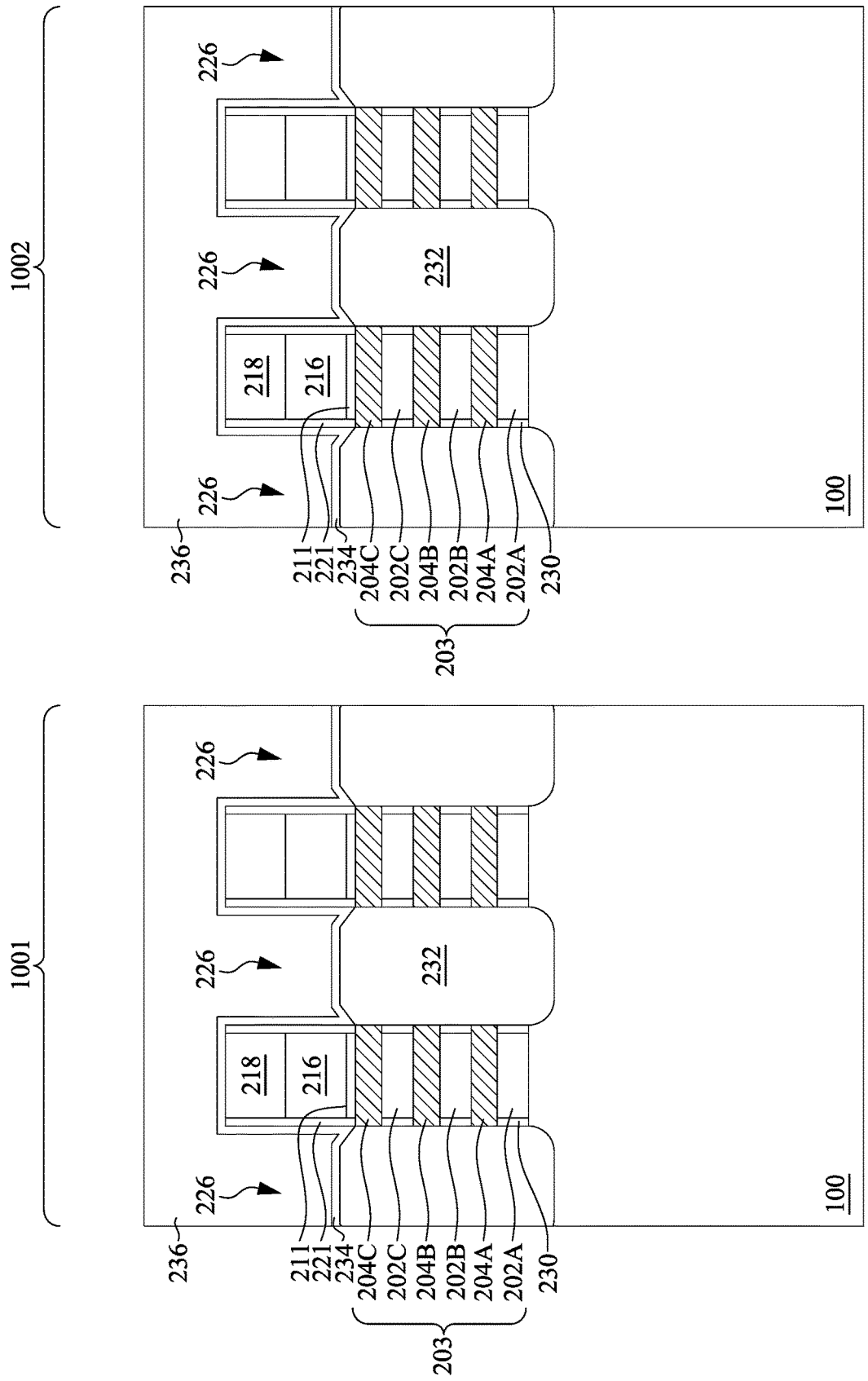
Figure 13C:
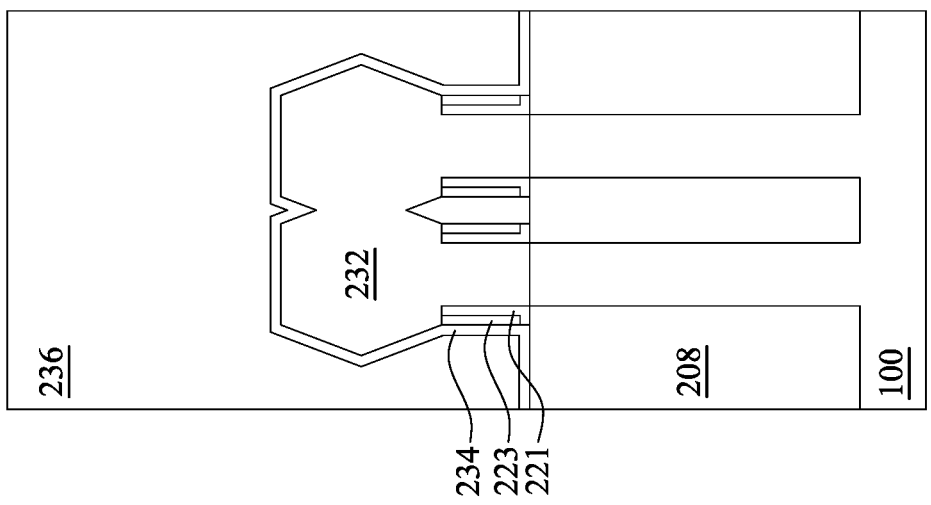

In FIGS. 13A-13C, an interlayer dielectric (ILD) layer 236 is deposited over the structure illustrated in FIGS. 12A-12B. The ILD layer 236 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 234 is disposed between the ILD layer 236 and the epitaxial source/drain regions 232, the masks 218, and the first spacers 221. The CESL 234 may comprise a dielectric material, such as, silicon nitride, silicon oxide, silicon oxynitride, or the like, having a different etch rate than the material of the overlying ILD layer 236.

Figure 14A:
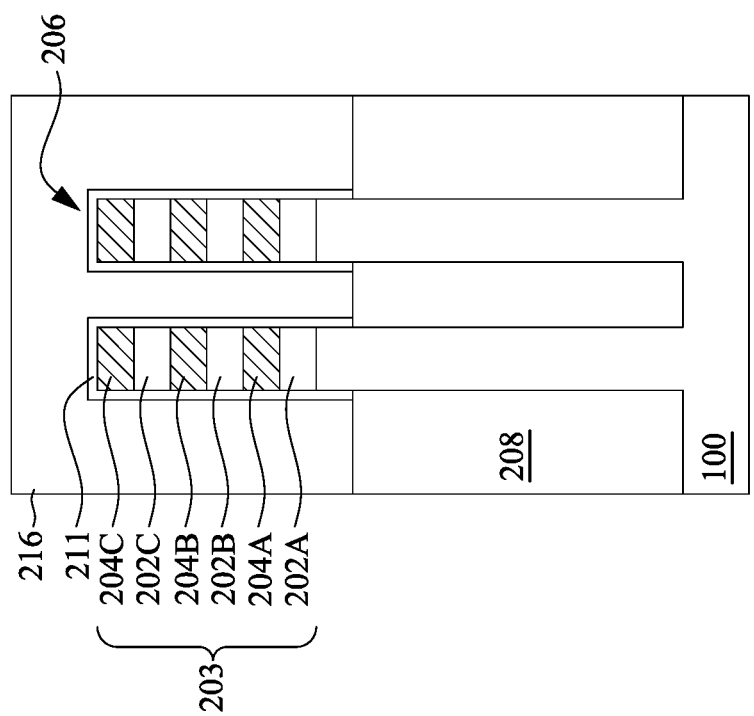
Figure 14B:
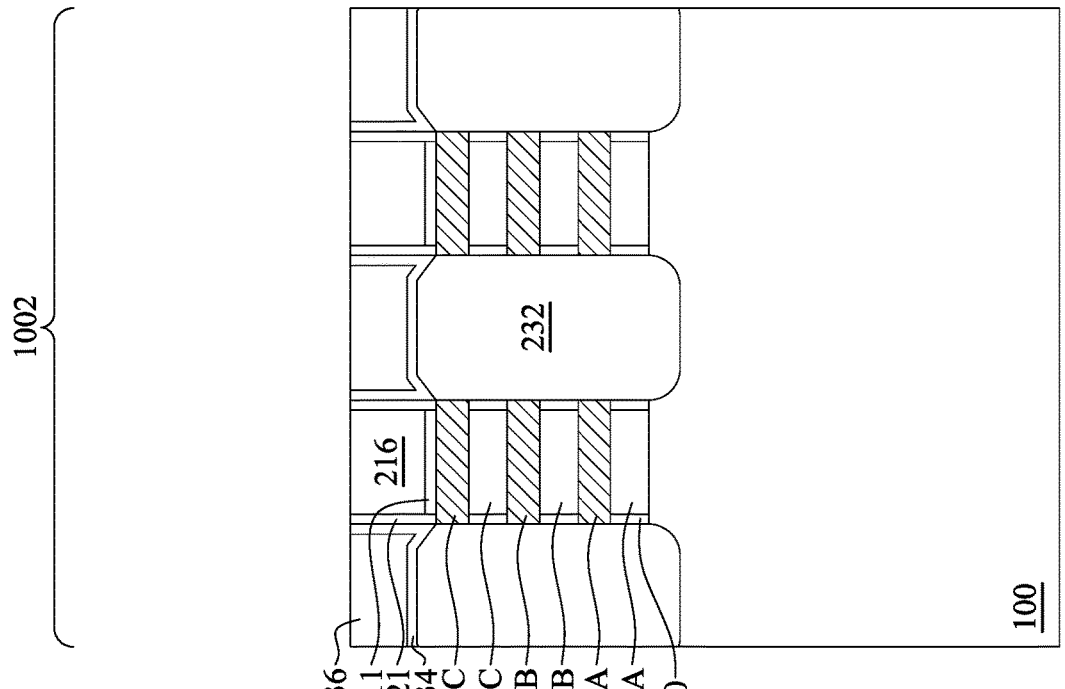
Figure 14B:
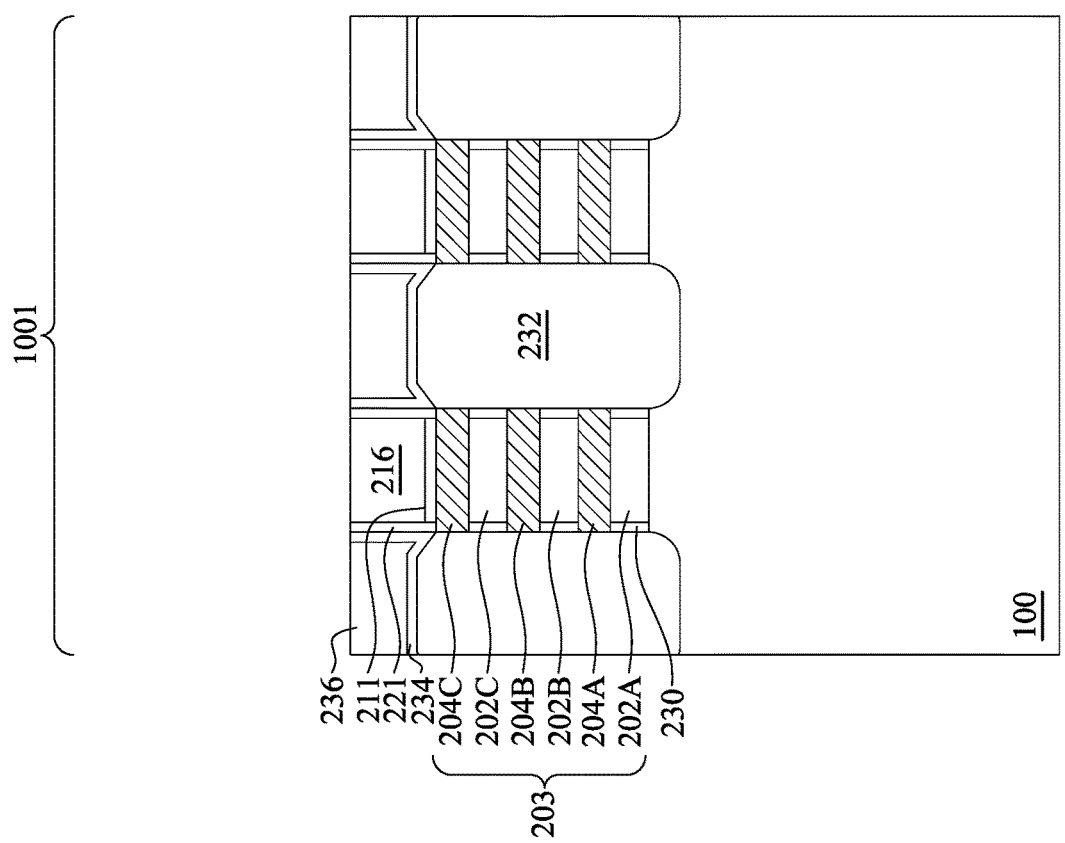

In FIGS. 14A-14B, a planarization process, such as a CMP, may be performed to level the top surface of the ILD layer 236 with the top surfaces of the dummy gates 216 or the masks 218. The planarization process may also remove the masks 218 on the dummy gates 216, and portions of the first spacers 221 along sidewalls of the masks 218. After the planarization process, top surfaces of the dummy gates 216, the first spacers 221, and the ILD layer 236 are level within process variations. Accordingly, the top surfaces of the dummy gates 216 are exposed through the ILD layer 236. In some embodiments, the masks 218 may remain, in which case the planarization process levels the top surface of the ILD layer 236 with top surface of the masks 218 and the first spacers 221.

Figure 15A:
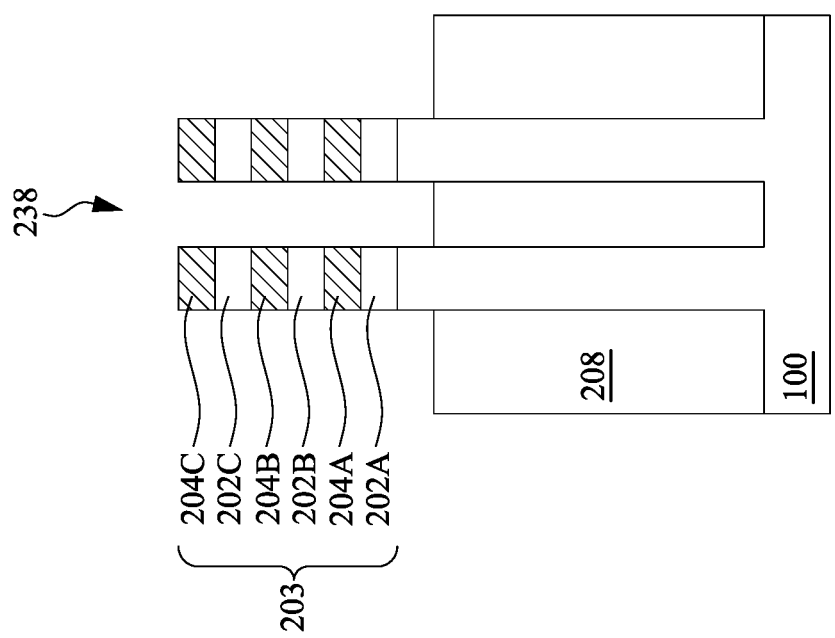
Figure 15B:
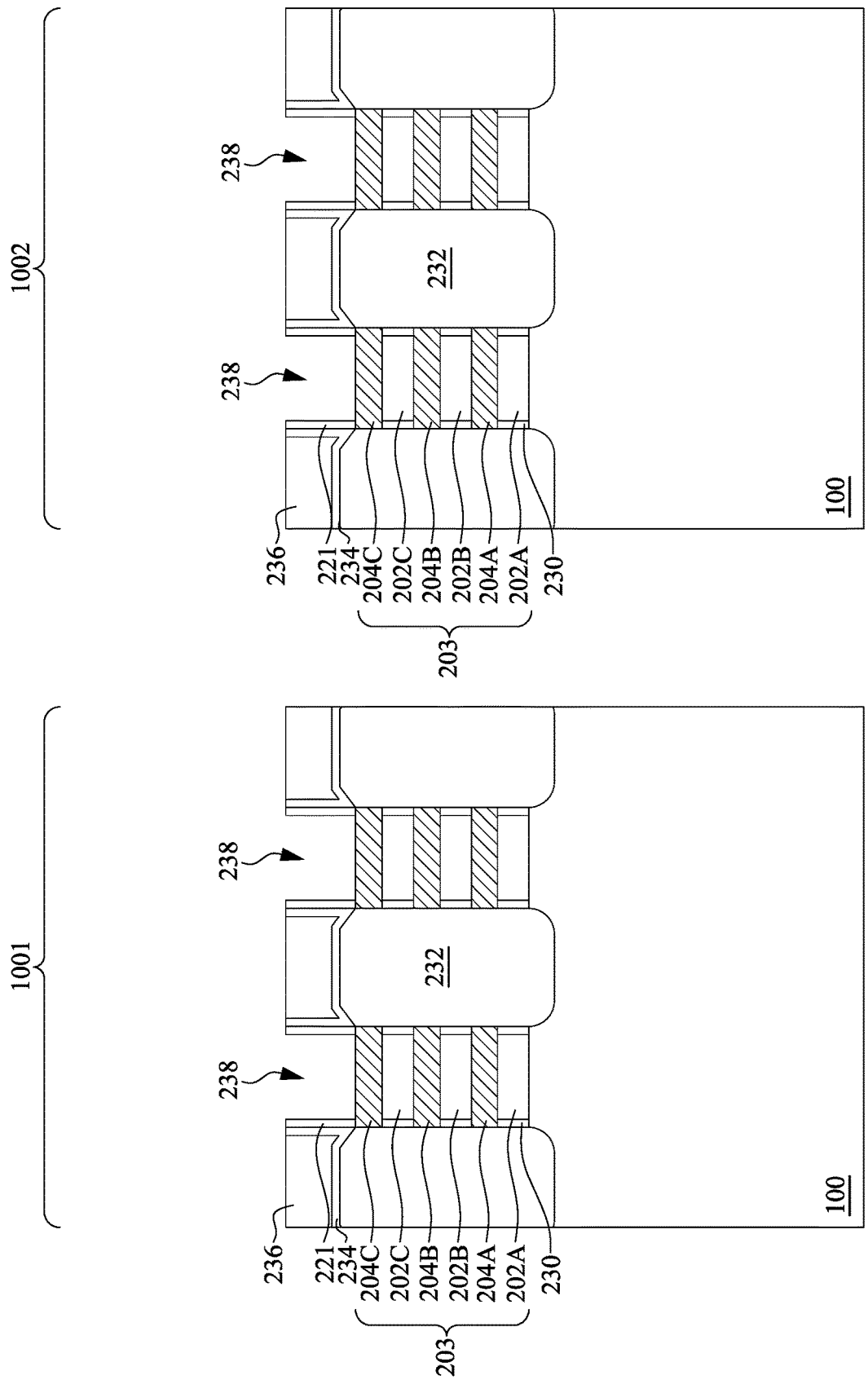

In FIGS. 15A and 15B, the dummy gates 216, and the masks 218 if present, are removed in one or more etching steps, so that gate trenches 238 are formed between corresponding gate spacers 221. In some embodiments, portions of the dummy gate dielectrics 211 in the gate trenches 238 are also be removed. In some embodiments, the dummy gates 216 and the dummy gate dielectrics 211 are removed by an anisotropic dry etch process. For example, the etching process may include a dry etch process using reaction gas(es) that selectively etch the dummy gates 216 at a faster rate than the ILD layer 236 or the first spacers 221. Each gate trench 238 exposes and/or overlies portions of nanostructures 204, which act as channel regions in subsequently completed GAA-FETs. The nanostructures 204 which act as the channel regions are disposed between neighboring pairs of the epitaxial source/drain regions 232. During the removal, the dummy gate dielectrics 211 may be used as etch stop layers when the dummy gates 216 are etched. The dummy gate dielectrics 211 may then be removed after the removal of the dummy gates 216.

Figure 16:
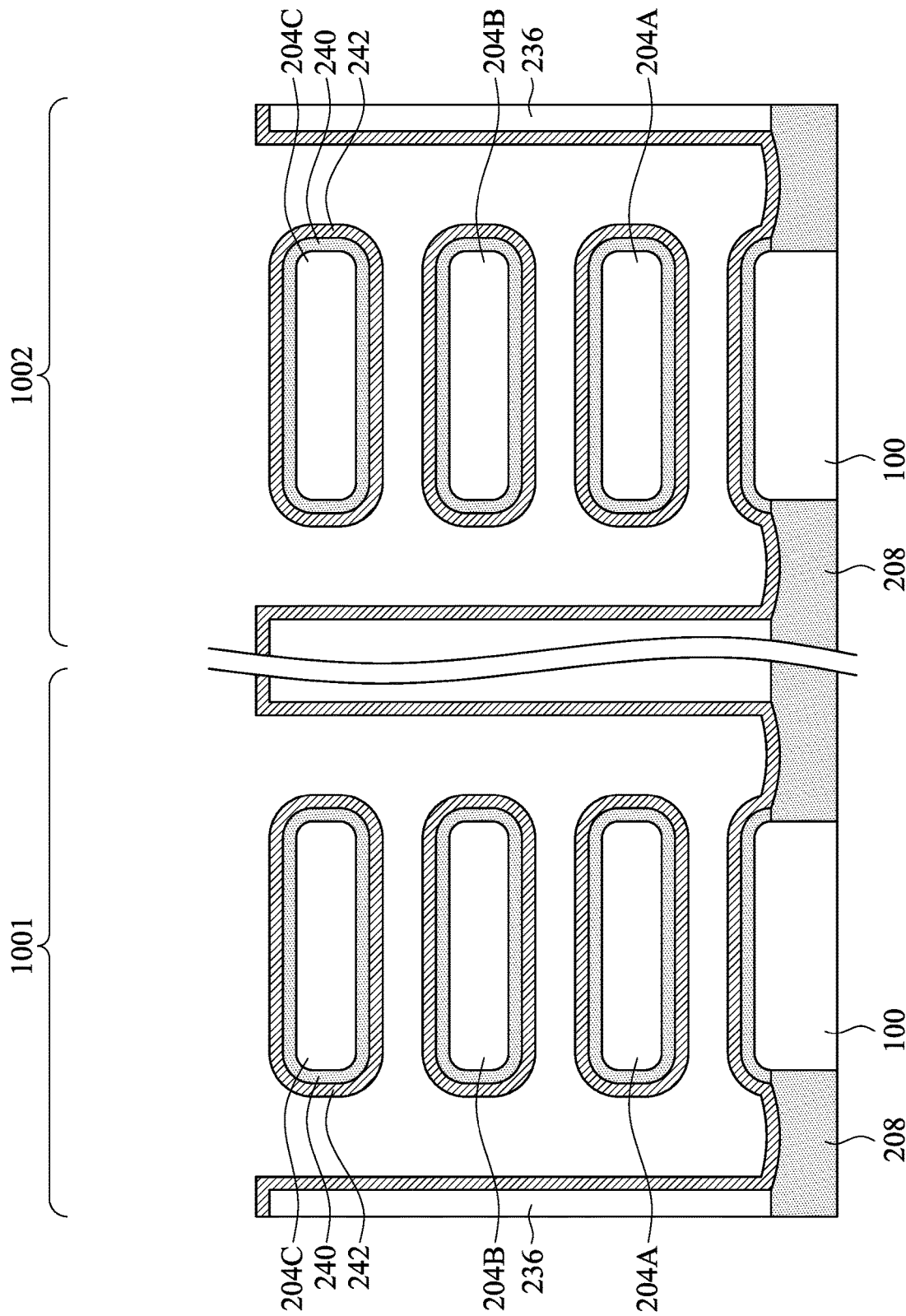
FIGS. 16, 17, 18, 19, 20A, 20B, 21A, and 21B are cross-sectional views at intermediate fabrication stages, illustrating reference cross-section A-A' illustrated in FIG. 1 that extends through a gate region along a longitudinal axis of the gate region.

The first nanostructures 202 in the gate trenches are removed by an isotropic etching process such as wet etching or the like using etchants which are selective to the materials of the first nanostructures 202, as shown in FIG. 16. Stated differently, the first nanostructures 202 are removed by using a selective etching process that etches the first nanostructures 202 at a faster etch rate than it etches the second nanostructures 204, thus forming spaces between the second nanostructures 204 (also referred to as sheet-sheet spaces if the nanostructures 204 are nanosheets). This step can be referred to as a channel release process. At this interim processing step, the spaces between second nanostructures 204 may be filled with ambient environment conditions (e.g., air, nitrogen, etc). In some embodiments, the second nanostructures 204 can be referred to as nanosheets, nanowires, nanoslabs, nanorings having nano-scale size (e.g., a few nanometers), depending on their geometry. For example, in some embodiments the second nanostructures 204 may be trimmed to have a substantial rounded shape (i.e., cylindrical) due to the selective etching process for completely removing the first nanostructures 202. In that case, the resultant second nanostructures 204 can be called nanowires.

In embodiments in which the first nanostructures 202 include, e.g., SiGe, and the second nanostructures 204 include, e.g., Si or SiC, tetramethylammonium hydroxide (TMAH), ammonium hydroxide ($NH_4OH$) or the like may be used to remove the first nanostructures 202. In some embodiments, both the channel release step and the previous step of laterally recessing first nanostructures 202 (i.e., the step as illustrated in FIGS. 10A-10B) use a selective etching process that etches first nanostructures 202 (e.g., SiGe) at a faster etch rate than etching second nanostructures 204 (e.g., Si), and therefore these two steps may use the same etchant chemistry in some embodiments. In this case, the etching time/duration of channel release step is longer than the etching time/duration of the previous step of laterally recessing first nanostructures 202, so as to completely remove the sacrificial nanostructures 202.

An interfacial layer 240 and a gate dielectric layer 242 are deposited conformally in the gate trenches 238 in both the first device region 1001 and the second device region 1002. The interfacial layer 240 may include an oxide-containing material such as silicon oxide or silicon oxynitride and may be formed by chemical oxidation using an oxidizing agent (e.g., hydrogen peroxide ($H_2O_2$), ozone ($O_3$)), plasma enhanced atomic layer deposition, thermal oxidation, ALD, CVD, and/or other suitable methods. In some embodiments, a cleaning process, such as an HF-last pre-gate cleaning process (for example, using a hydrofluoric (HF) acid solution), may be performed before the interfacial layer 240 is formed in the gate trenches 238. The gate dielectric layer 242 wraps around the second nanostructures 204. In some embodiments, the gate dielectric layer 242 includes high-k dielectric material having a high dielectric constant, for example, greater than that of thermal silicon oxide (~3.9). The high-k dielectric material may include hafnium oxide ($HfO_2$), zirconium oxide ($ZrO_2$), lanthanum oxide ($La_2O_3$), aluminum oxide ($Al_2O_3$), titanium oxide ($TiO_2$), yttrium oxide, strontium titanate, hafnium oxynitride ($HfO_xN_y$), other suitable metal-oxides, or combinations thereof. The gate dielectric layer 242 may be formed by ALD, chemical vapor deposition (CVD), physical vapor deposition (PVD), remote plasma CVD (RPCVD), plasma enhanced CVD (PECVD), metal organic CVD (MOCVD), sputtering, other suitable processes, or combinations thereof.

Figure 17:
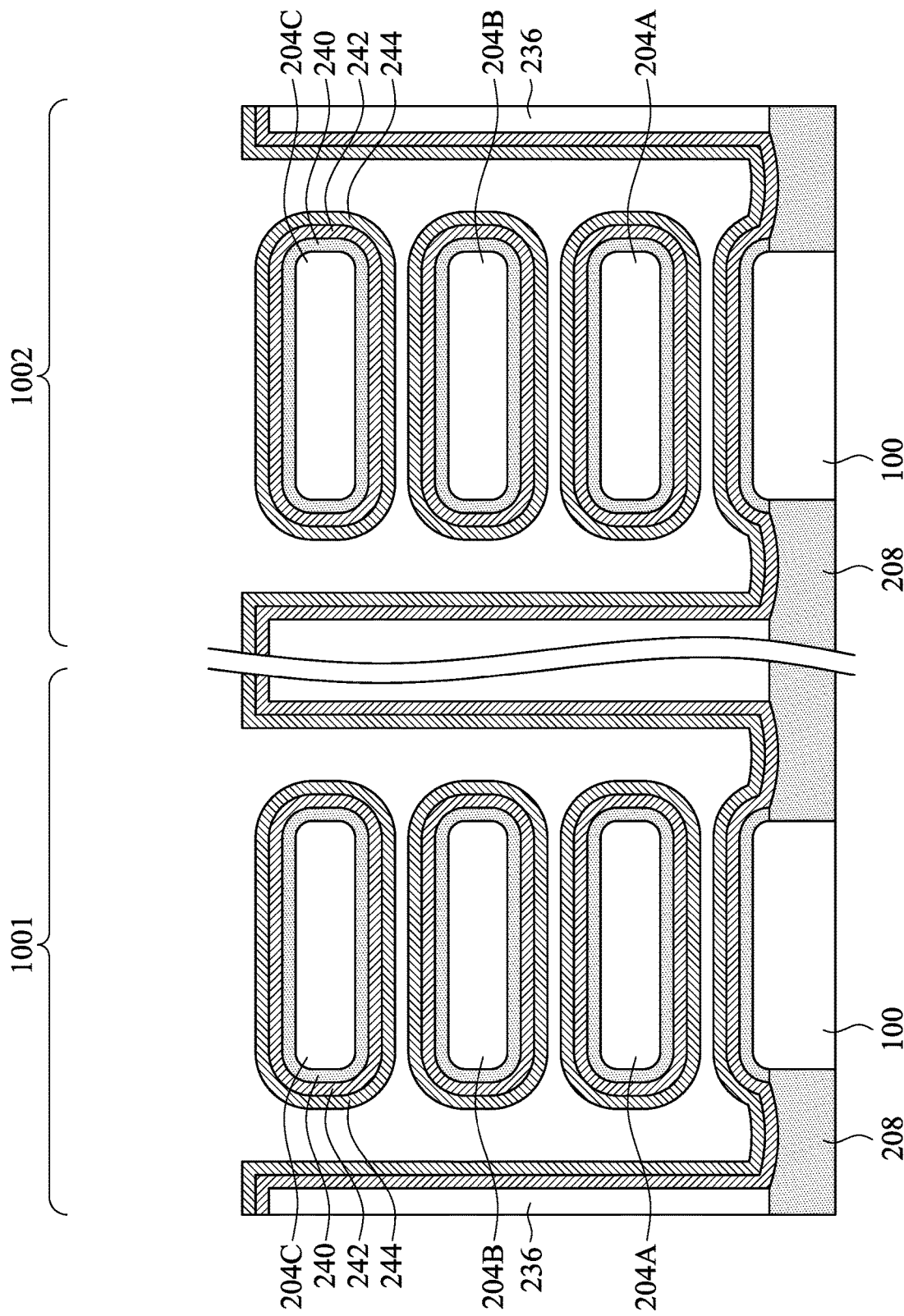

In FIG. 17, a hard mask layer 244 is deposited on the gate dielectric layer 242 in both the first device region 1001 and the second device region 1002. In some embodiments, the hard mask layer 244 includes aluminum oxide ($AlO_x$), which is deposited over the gate dielectric layer 242 using ALD, CVD or PVD.

Figure 18:
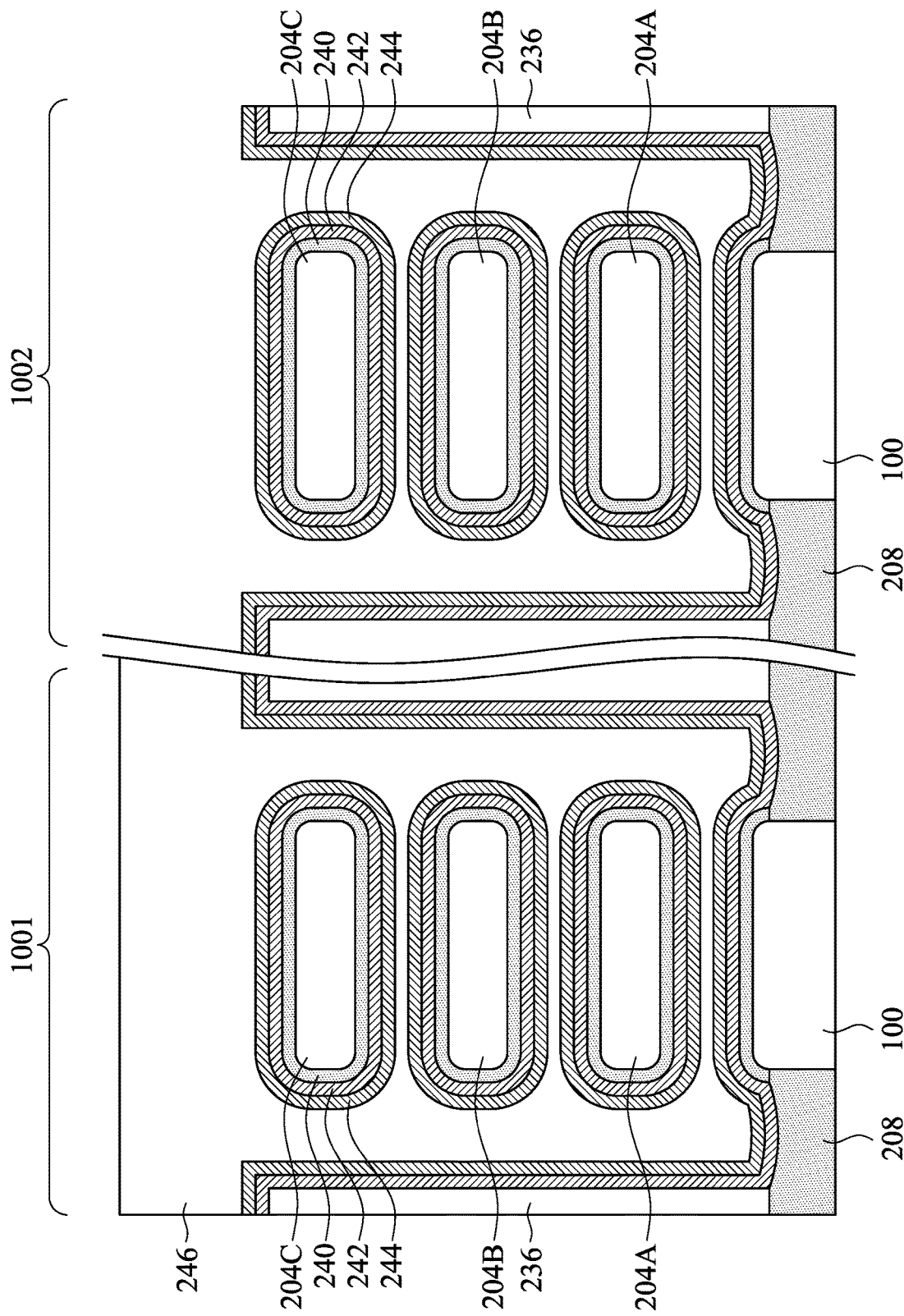

In FIG. 18, a photoresist layer 246 is then formed over the hard mask layer 244 and patterned to expose the second device region 1002 but not expose the first device region 1001. In some embodiments, the photoresist layer 246 is an organic material formed using a spin-on coating process, followed by patterning the organic material to expose the second device region 1002 using suitable photolithography techniques. For example, photoresist material is irradiated (exposed) and developed to remove portions of the photoresist material. In greater detail, a photomask or reticle (not shown) may be placed above the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used.

After the patterned photoresist layer 246 is formed, the exposed portion of the hard mask layer 244 in the second device region 1002 is removed by using the patterned photoresist layer 246 as an etch mask, so that the gate dielectric layer 242 is exposed in the second device region 1002. In some embodiments, the hard mask layer 244 may be etched by using a plasma dry etching using fluorine-based and/or chlorine-based etchants.

For example, the hard mask layer 244 may be removed by a wet etching process using an etchant that is selective to the material of the hard mask layer 244. Stated differently, the etchant used in removing the hard mask layer 244 etches the material (e.g., aluminum oxide) of the hard mask layer 244 at a faster etch rate than etching the material of the gate dielectric layer 242.

Figure 19:
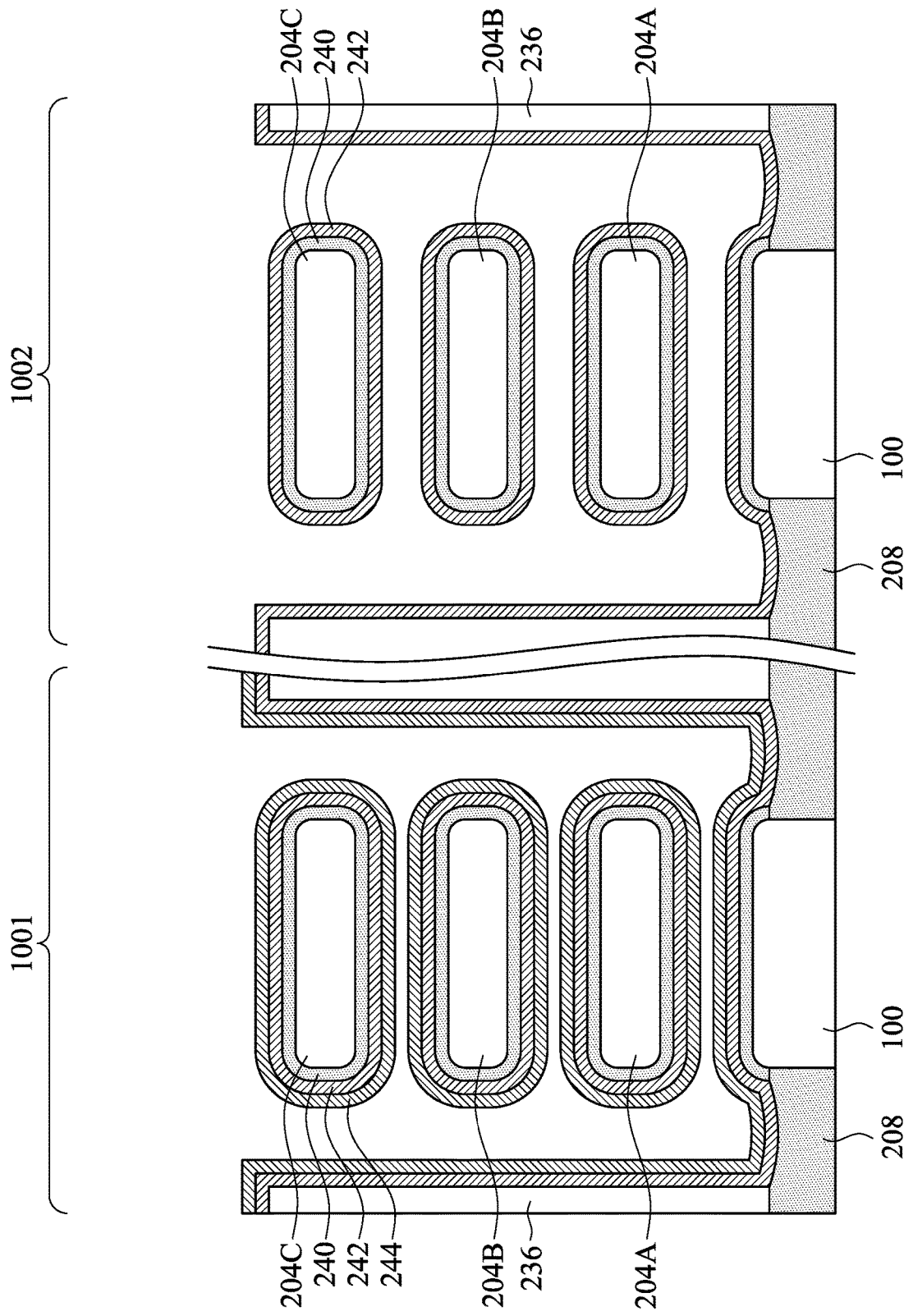

Next, the photoresist layer 246 is removed from the first device region 1001 by using, for example, a plasma ash process. The resultant structure is illustrated in FIG. 19. In some embodiments, a plasma ash process is performed such that the temperature of the organic material of the photoresist is increased until these organic materials experience a thermal decomposition and may be removed.

Figure 20A:
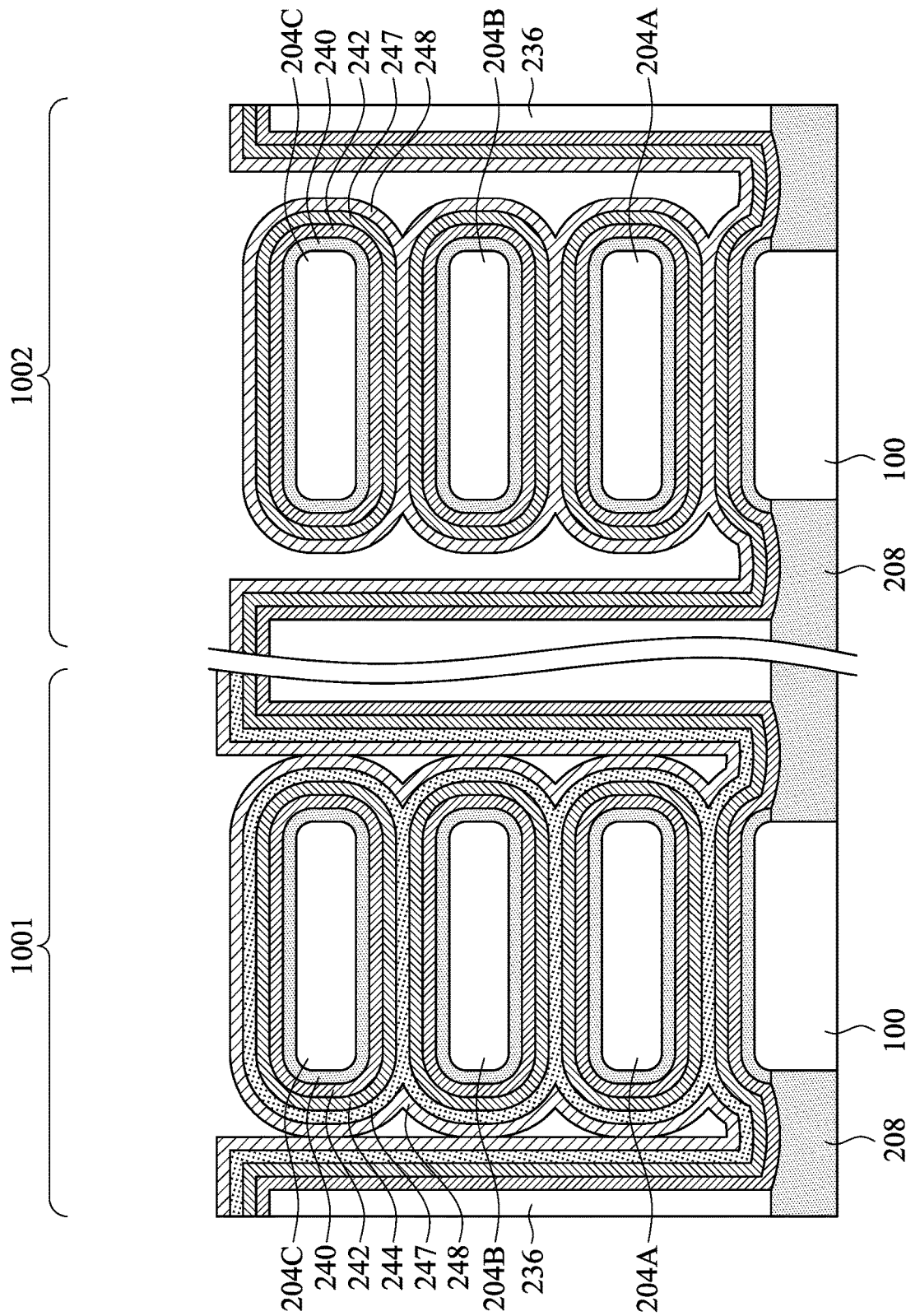
Figure 21A:
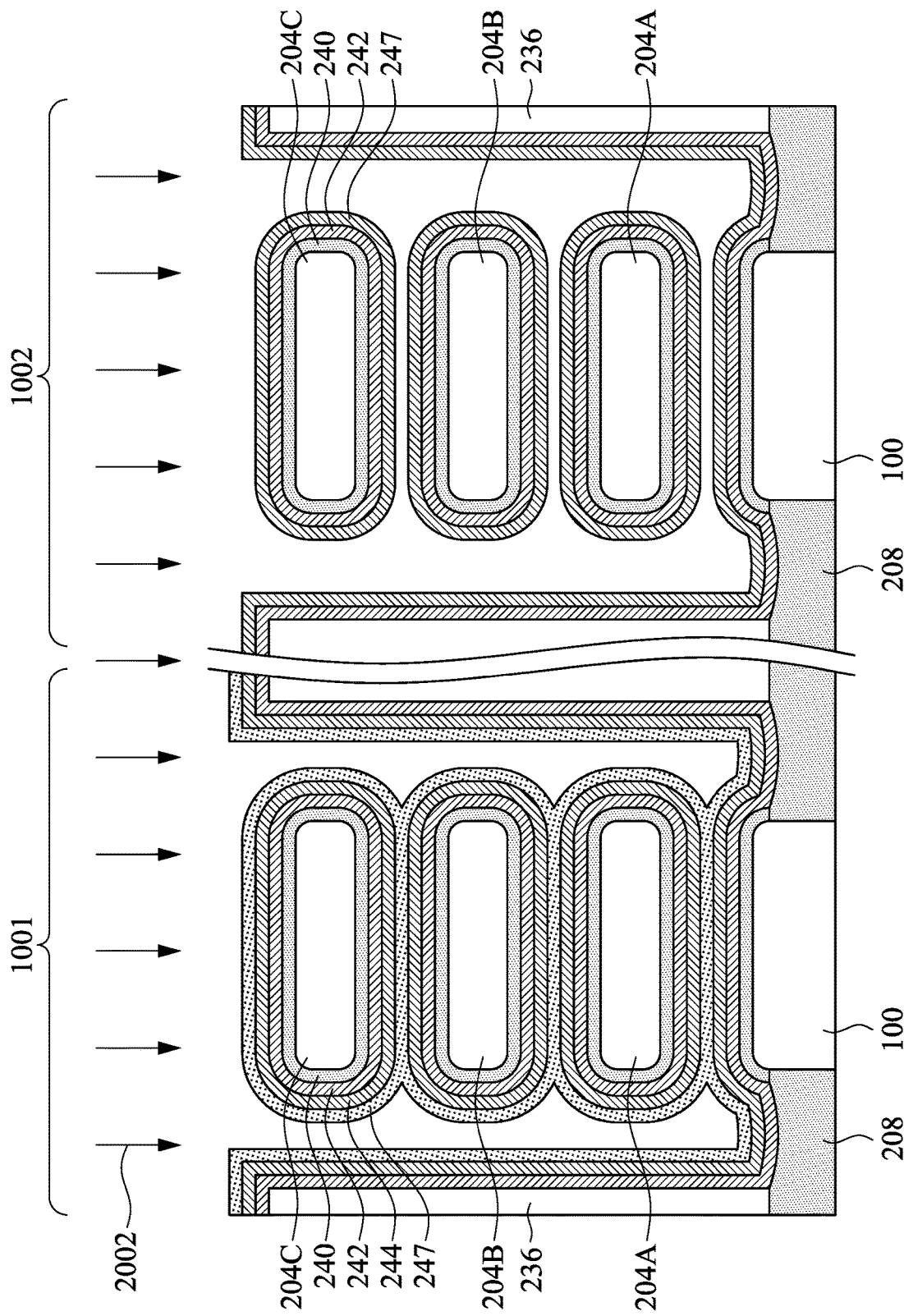

In FIG. 20A, a barrier layer 247 is formed on the hard mask layer 244 in the first device region 1001 and over the gate dielectric layer 242 in the second device region 1002. After the barrier layer 247 is formed, a fluorine-containing layer 248 is formed on the barrier layer 247. In some embodiments, the barrier layer 247 includes TiN, TaN, Titanium Silicon Nitride (TSN), or the like. The fluorine-containing layer 248 is a conductive element such as tungsten (W) deposited using a fluorine-containing precursor by ALD, CVD, or the like. In some embodiments where the fluorine-containing layer 248 is tungsten, a fluorine-containing precursor gas, such as hexafluoride ($WF_6$), and silane ($SiH_4$) are used as precursor gases for depositing the tungsten. By using the fluorine-containing gas to form the tungsten, residual fluorine atoms from the fluorine-containing gas may inherently exist in the fluorine-containing layer 248. The fluorine-containing layer 248 may be deposited at a temperature in a range from 250° C. to 475° C. and under a process pressure in a range from 0.5 torr to 400 torr.

In some embodiments where the fluorine-containing layer 248 is formed using ALD process, the ALD process is performed by sequentially exposing the surface of the barrier layer 247 to two different gaseous precursors in a cyclic manner, i.e., alternating application of a first gaseous precursor and a second gaseous precursor to an exposed surface of the barrier layer 247. In some embodiments, the first gaseous precursor is a fluorine-containing gas, such as $WF_6$. The second gaseous precursor includes elements such as silicon (Si) and hydrogen (H). Examples of the second gaseous precursor include silane ($SiH_4$). The barrier layer 247 can help prevent the fluorine-containing gas to damage the underlying layer (e.g., the gate dielectric layer 242) during forming the fluorine-containing layer 248. In some other embodiments, the barrier layer 247 can be omitted.

Figure 20B:
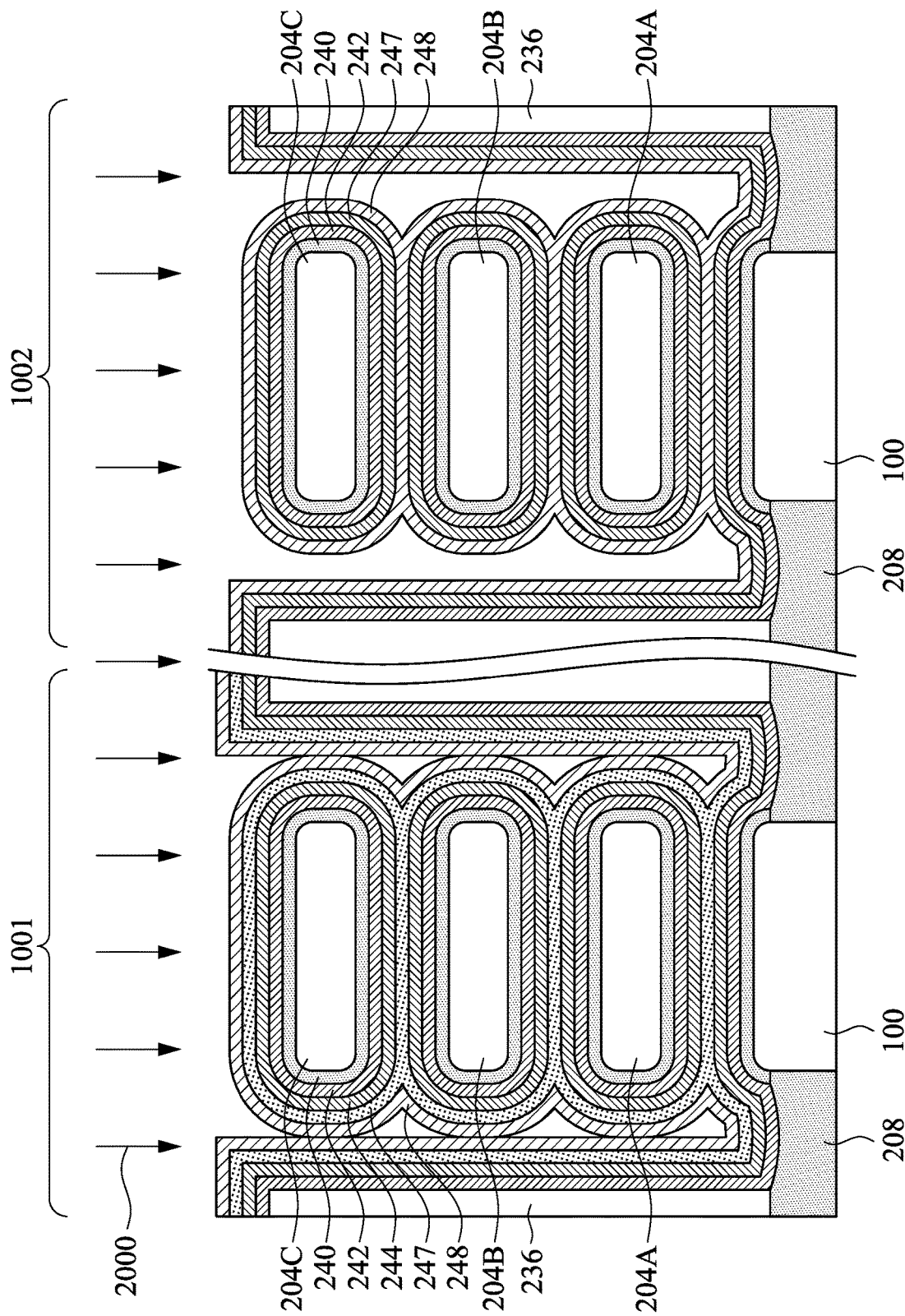

In FIG. 20B, an anneal process 2000 is performed to drive the fluorine atoms from the fluorine-containing layer 248 to diffuse through the barrier layer 247 into the gate dielectric layer 242 and the interfacial layer 240 in the second device region 1002. In some embodiments, the anneal process 2000 is performed at a temperature in a range from 150° C. to 750° C. for a duration in a range from 0.5 seconds to 60 seconds. During the anneal process 2000, the hard mask layer 244 in the first device region 1001 can serve as a fluorine diffusion barrier that prevents the fluorine atoms in the fluorine-containing layer 248 in the first device region 1001 from driving into the gate dielectric layer 242 and the interfacial layer 240 in the first device region 1001. In other words, the gate dielectric layer 242 and the interfacial layer 240 in the first device region 1001 are fluorine-free after the anneal process 2000 is completed. Therefore, the gate dielectric layer 242 and the interfacial layer 240 in the first device region 1001 have a lower fluorine atomic concentration than that in the second device region 1002, or the gate dielectric layer 242 and the interfacial layer 240 in the first device region 1001 may be fluorine-free.

In some other embodiments, instead of forming the fluorine-containing layer 248, a thermal soaking process followed by the anneal process is performed. Reference is made first to FIG. 21A. In some other embodiments, after the barrier layer 247 is formed, a thermal soaking process 2002 is performed on an exposed surface of the barrier layer 247 using a fluorine-containing gas to embed fluorine atoms into the barrier layer 247. Examples of the fluorine-containing gas include $NF_3$, $WF_6$, a combination thereof, or the like.

During the thermal soaking process 2002, the structure in FIG. 21A is heated in a non-plasma ambient, for example, at an elevated temperature in a range from 250° C. to 475° C. under a pressure in a range from 0.5 torr to 50 torr. The soaking duration may be in a range from 0.1 second to 1 hour.

Figure 21B:
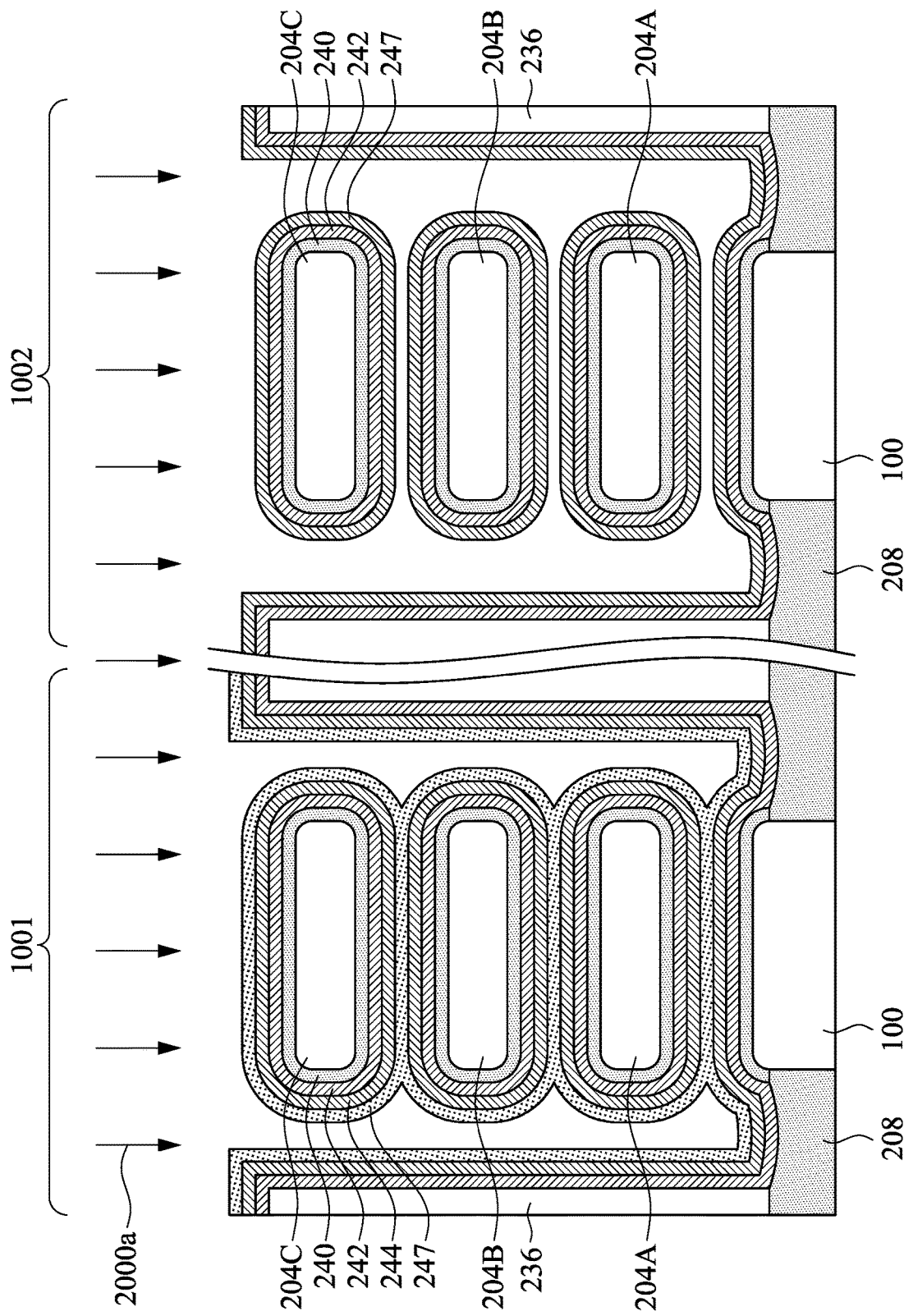
Figure 22:
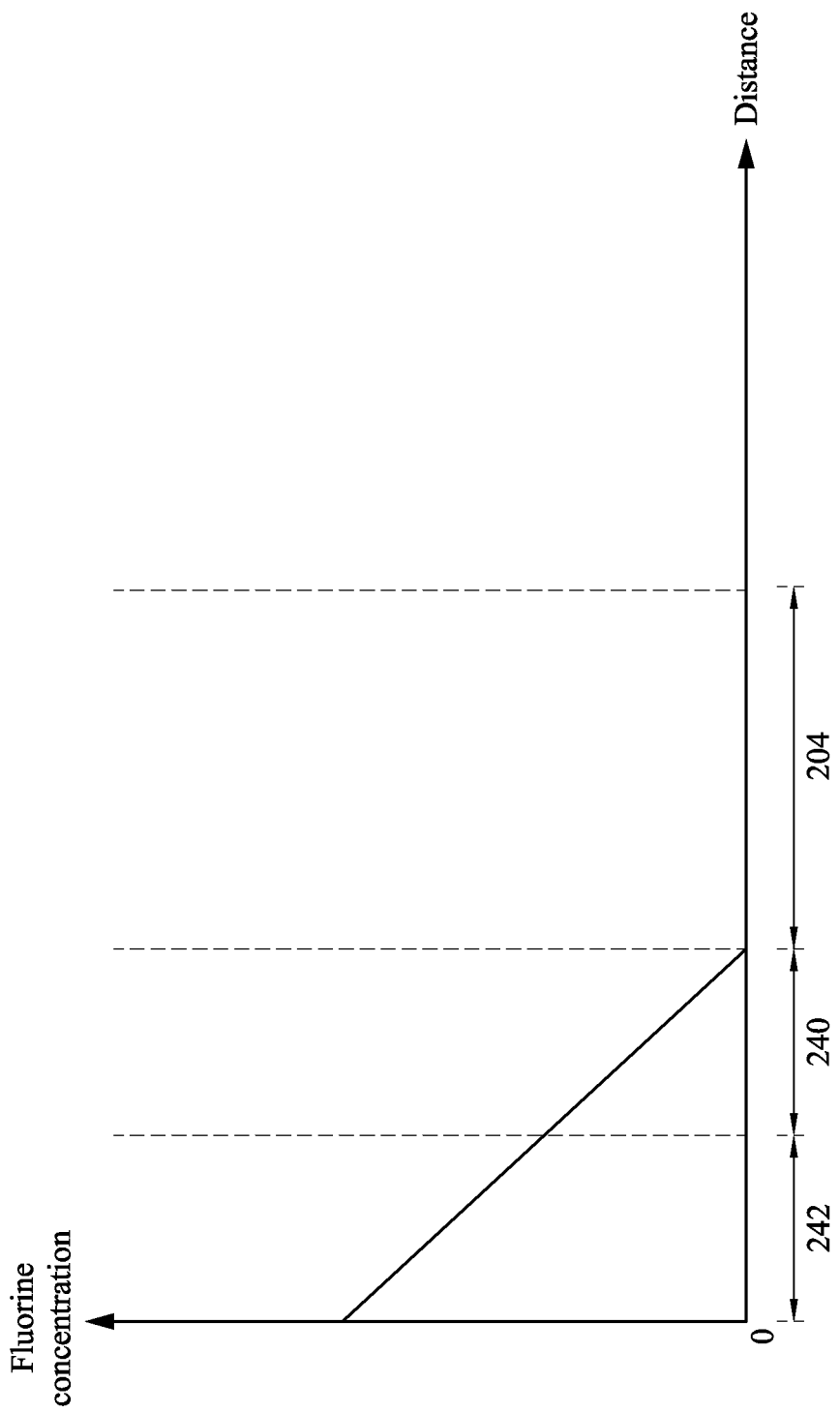
FIG. 22 is a graph illustrating a fluorine concentration in the high-k gate dielectric layer, the interfacial layer and the nanostructure in accordance with some embodiments.

In FIG. 21B, after the thermal soaking process 2002, an anneal process 2000a is performed to drive the fluorine atoms from the barrier layer 247 into the gate dielectric layer 242 and the interfacial layer 240 in the second device region 1002. The anneal process 2000a is similar to the anneal process 2000 with regard to FIG. 20B. During the anneal process 2000a, the hard mask layer 244 in the first device region 1001 can serve as a fluorine diffusion barrier to prevent the fluorine atoms from driving into the gate dielectric layer 242 and the interfacial layer 240 in the first device region 1001. Therefore, the gate dielectric layer 242 and the interfacial layer 240 in the first device region 1001 have a lower fluorine atomic concentration than that in the second device region 1002, or the gate dielectric layer 242 and the interfacial layer 240 in the first device region 1001 may be fluorine-free.

Fluorine can passivate interfacial and/or bulk defects for each of the interfacial layer 240 and the gate dielectric layer 242 by filling the oxygen vacancies and attaching to interfacial dangling bonds. By including fluorine in the gate dielectric layer 242 and the interfacial layer 240, charge trapping and interfacial charge scattering can be reduced, which in turn may reduce oxide leakage current, improve threshold voltage stability and device performance. In some embodiments where the first device region 1001 is n-type device region, in the absence of fluorine in the gate dielectric layer 242 and the interfacial layer 240 in the first device region 1001, unwanted threshold voltage degradation of an NMOS device (increasing NMOS threshold voltage) may be prevented. As a result, threshold voltages of the resulting devices in different device regions (e.g., the first device region 1001 and the second device region 1002) can be individually tuned to meet different target threshold voltages for different devices.

FIG. 22 is a graph illustrating a fluorine concentration in the gate dielectric layer 242, the interfacial layer 240 and the nanostructure 204 in accordance with some embodiments. In some embodiments, the gate dielectric layer 242 and the interfacial layer 240 may each have a fluorine concentration gradient. For example, the gate dielectric layer 242 has a fluorine concentration decreasing in a direction toward the nanostructure 204. The interfacial layer 240 has a fluorine concentration decreasing in a direction toward the nanostructure 204 as well.

Figure 23:
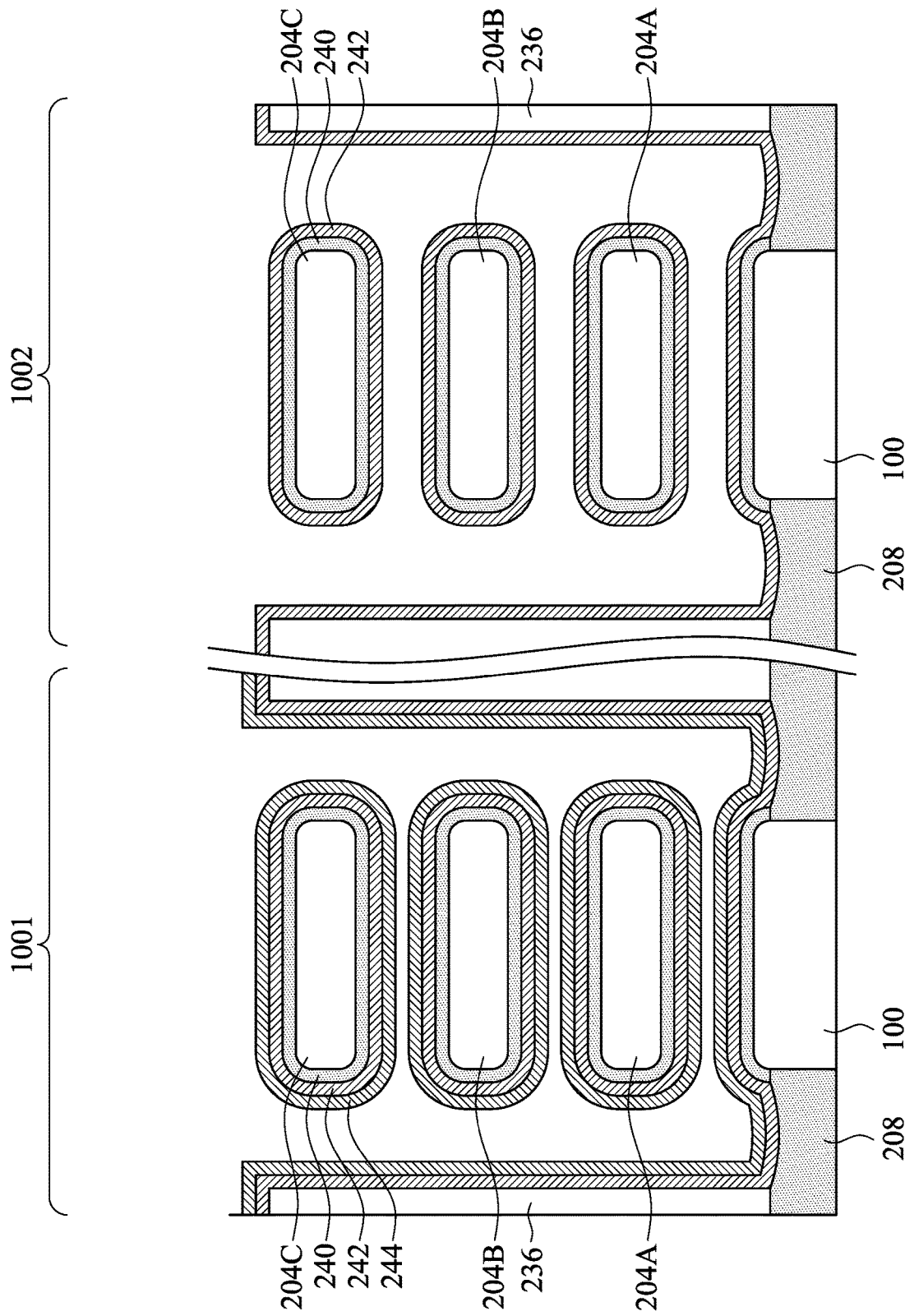
FIGS. 23, 24, 25, 26, 27 and 28 are cross-sectional views at intermediate fabrication stages, illustrating reference cross-section A-A' illustrated in FIG. 1 that extends through a gate region along a longitudinal axis of the gate region.

Reference is made to FIG. 23. After the anneal process 2000, the fluorine-containing layer 248 and the barrier layer 247 (if present) are removed, for example, using a wet removal process such as wet etch using HCl, $H_2O_2$, $H_2O$, a combination thereof, or the like.

Figure 24:
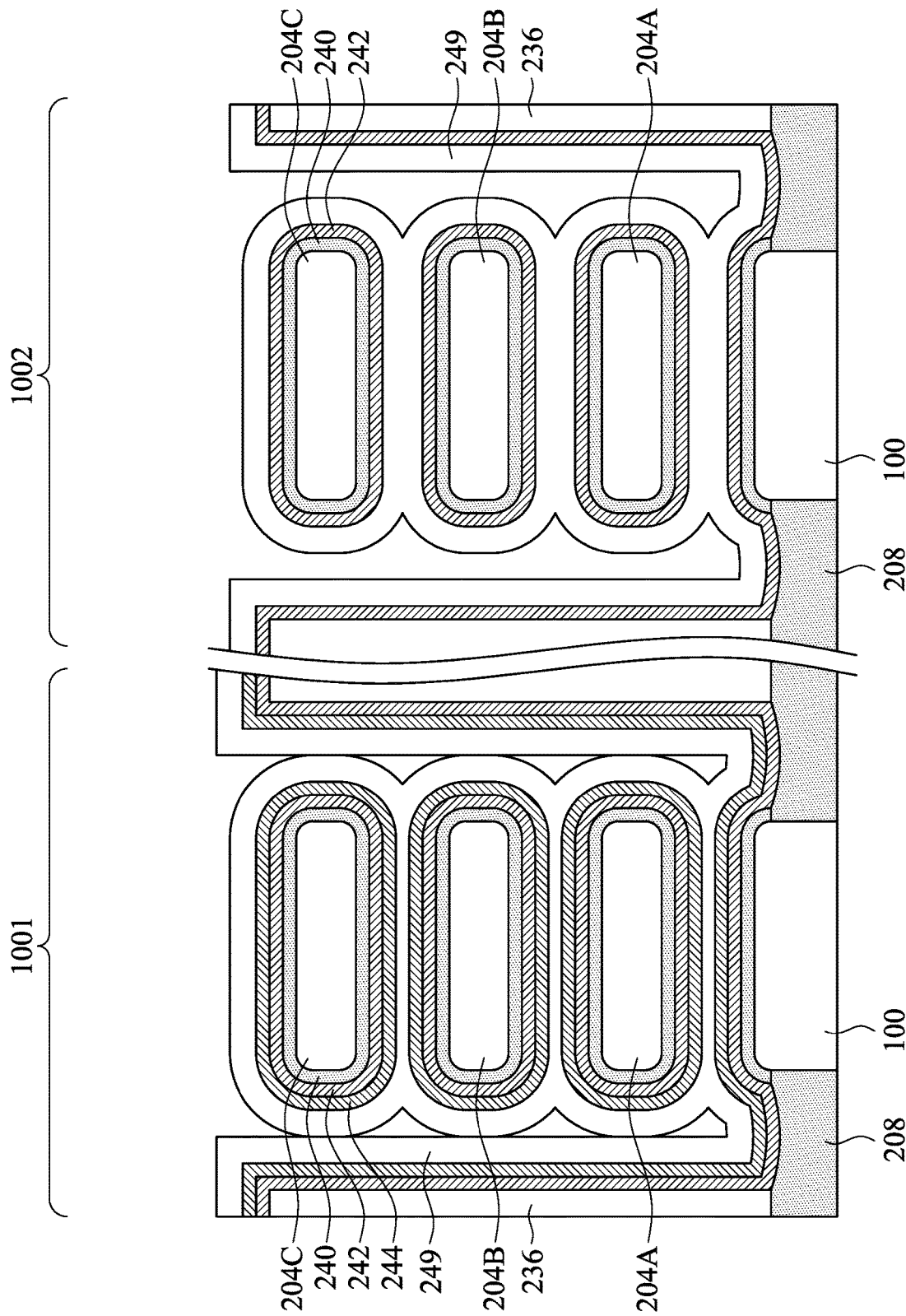

In FIG. 24, one or more p-type work function metal layers 249 are deposited on the hard mask layer 244 in the first device region 1001 and on the gate dielectric layer 242 in the second device region 1002. The one or more p-type work function metal layers 249 may include one or more work function metals to provide a suitable work function for the high-k/metal gate structures. The one or more p-type work function metal layers 249 may include one or more p-type work function metals (P-metal). The p-type work function metals may exemplarily include, but are not limited to, titanium nitride (TiN), tungsten nitride (WN), tungsten (W), ruthenium (Ru), palladium (Pd), platinum (Pt), cobalt (Co), nickel (Ni), conductive metal oxides, and/or other suitable materials.

Figure 25:
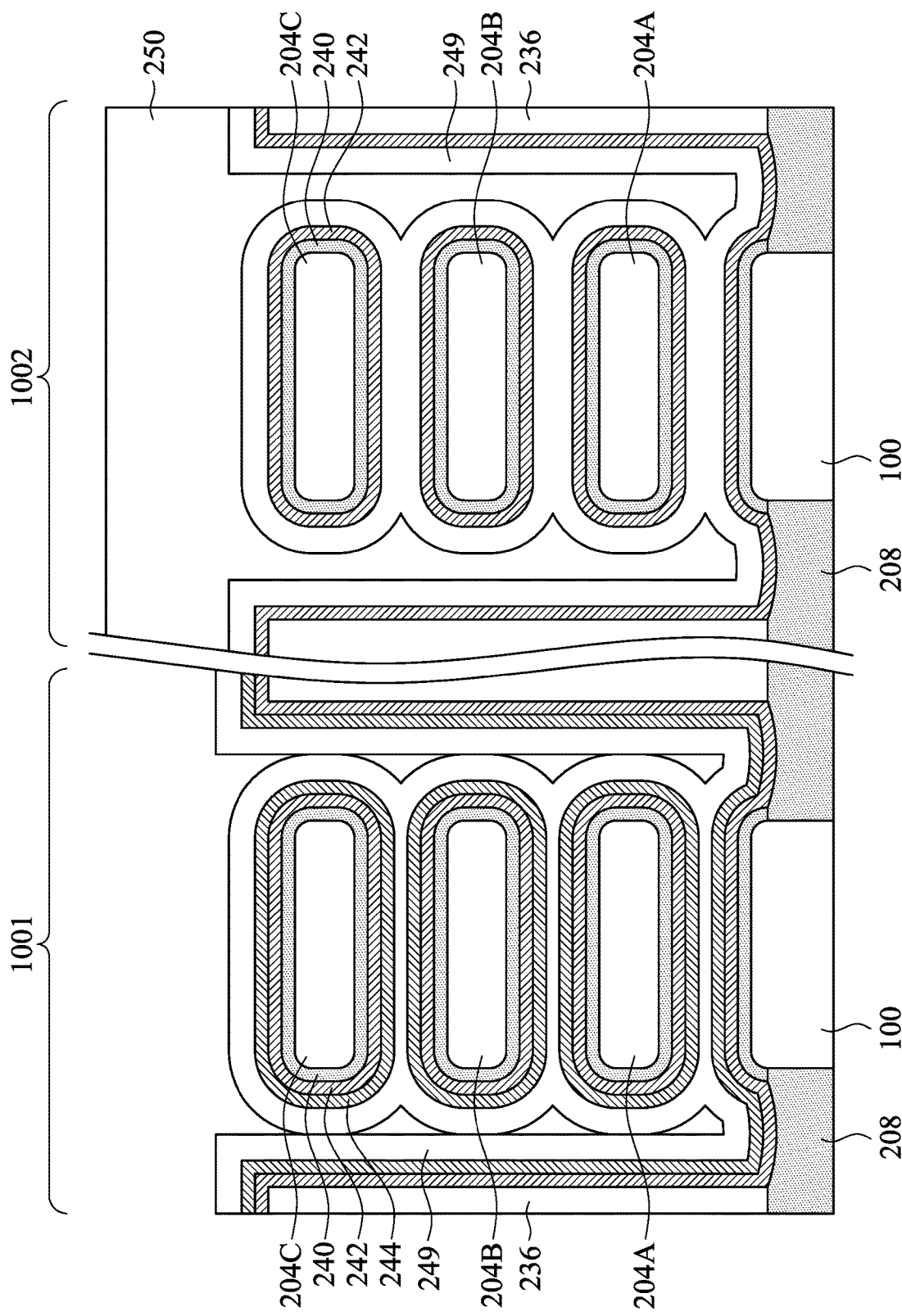

In FIG. 25, a photoresist layer 250 is then formed over the p-type work function metal layers 249 and patterned to expose the first device region 1001 but not expose the second device region 1002. In some embodiments, the photoresist layer 250 is an organic material formed using a spin-on coating process, followed by patterning the organic material to expose the first device region 1001 using suitable photolithography techniques. For example, photoresist material is irradiated (exposed) and developed to remove portions of the photoresist material. In greater detail, a photomask or reticle (not shown) may be placed above the photoresist material, which may then be exposed to a radiation beam which may be ultraviolet (UV) or an excimer laser such as a Krypton Fluoride (KrF) excimer laser, or an Argon Fluoride (ArF) excimer laser. Exposure of the photoresist material may be performed, for example, using an immersion lithography tool or an extreme ultraviolet light (EUV) tool to increase resolution and decrease the minimum achievable pitch. A bake or cure operation may be performed to harden the exposed photoresist material, and a developer may be used to remove either the exposed or unexposed portions of the photoresist material depending on whether a positive or negative resist is used.

After the patterned photoresist 250 is formed, the exposed p-type work function metal layers 249 and the underlying hard mask layer 244 in the first device region 1001 are removed by using the patterned photoresist as an etch mask, so that the gate dielectric layer 242 is exposed in the first device region 1001. In some embodiments, the hard mask layer 244 may be etched by using a plasma dry etching using fluorine-based and/or chlorine-based etchants. For example, the hard mask layer 244 may be removed by a wet etching process using an etchant that is selective to the material of the hard mask layer 244. Stated differently, the etchant used in removing the hard mask layer 244 etches the material (e.g., aluminum oxide) of the hard mask layer 244 at a faster etch rate than etching the material of the gate dielectric layer 242.

Figure 26:
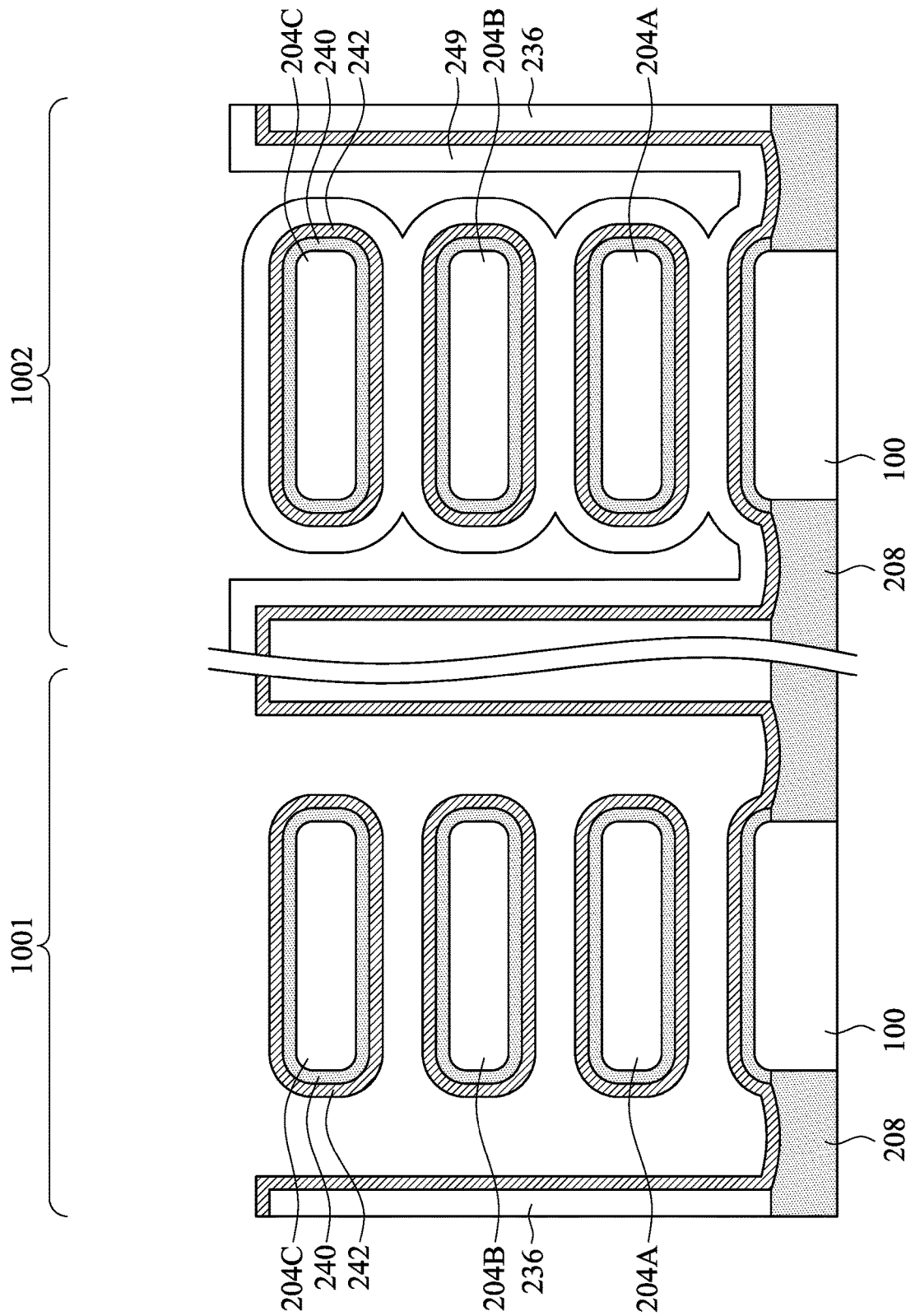

Next, the photoresist layer 250 is removed from the second device region 1002 by using, for example, a plasma ash process. The resultant structure is illustrated in FIG. 26. In some embodiments, a plasma ash process is performed such that the temperature of the organic material of the photoresist is increased until these organic materials experience a thermal decomposition and may be removed.

Figure 27:
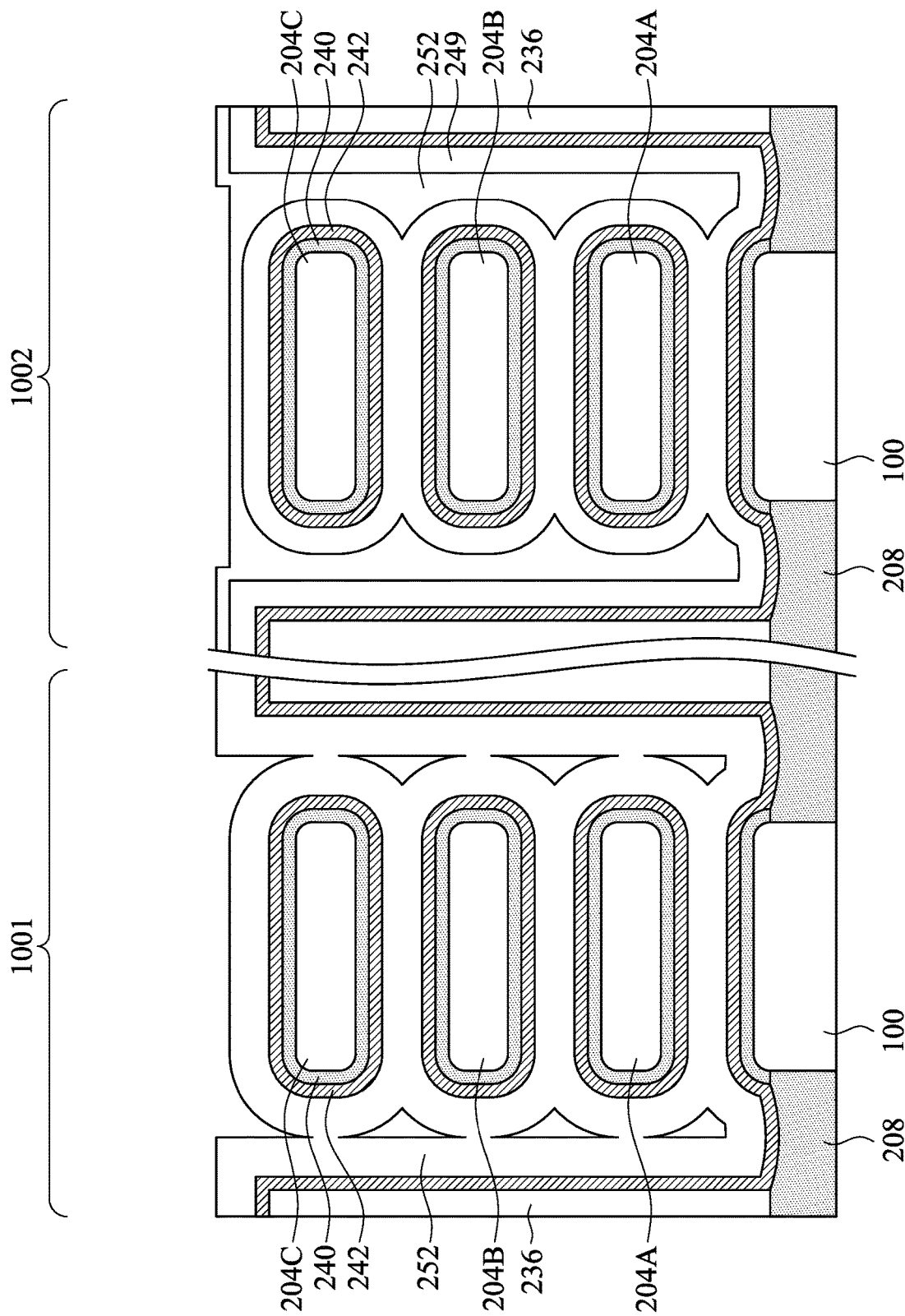

In FIG. 27, one or more n-type work function metal layers 252 are deposited on the gate dielectric layer 242 in the first device region 1001, and on the one or more p-type work function metal layers 249 in the second device region 1002.

The one or more n-type work function metal layers 252 may include one or more work function metals to provide a suitable work function for the high-k/metal gate structures. The one or more n-type work function metal layers 252 may include one or more n-type work function metals (N-metal). The n-type work function metals may exemplarily include, but are not limited to, titanium aluminide (TiAl), titanium aluminium nitride (TiAlN), carbo-nitride tantalum (TaCN), hafnium (Hf), zirconium (Zr), titanium (Ti), tantalum (Ta), aluminum (Al), metal carbides (e.g., hafnium carbide (HfC), zirconium carbide (ZrC), titanium carbide (TiC), aluminum carbide (AlC)), aluminides, and/or other suitable materials.

Figure 28:
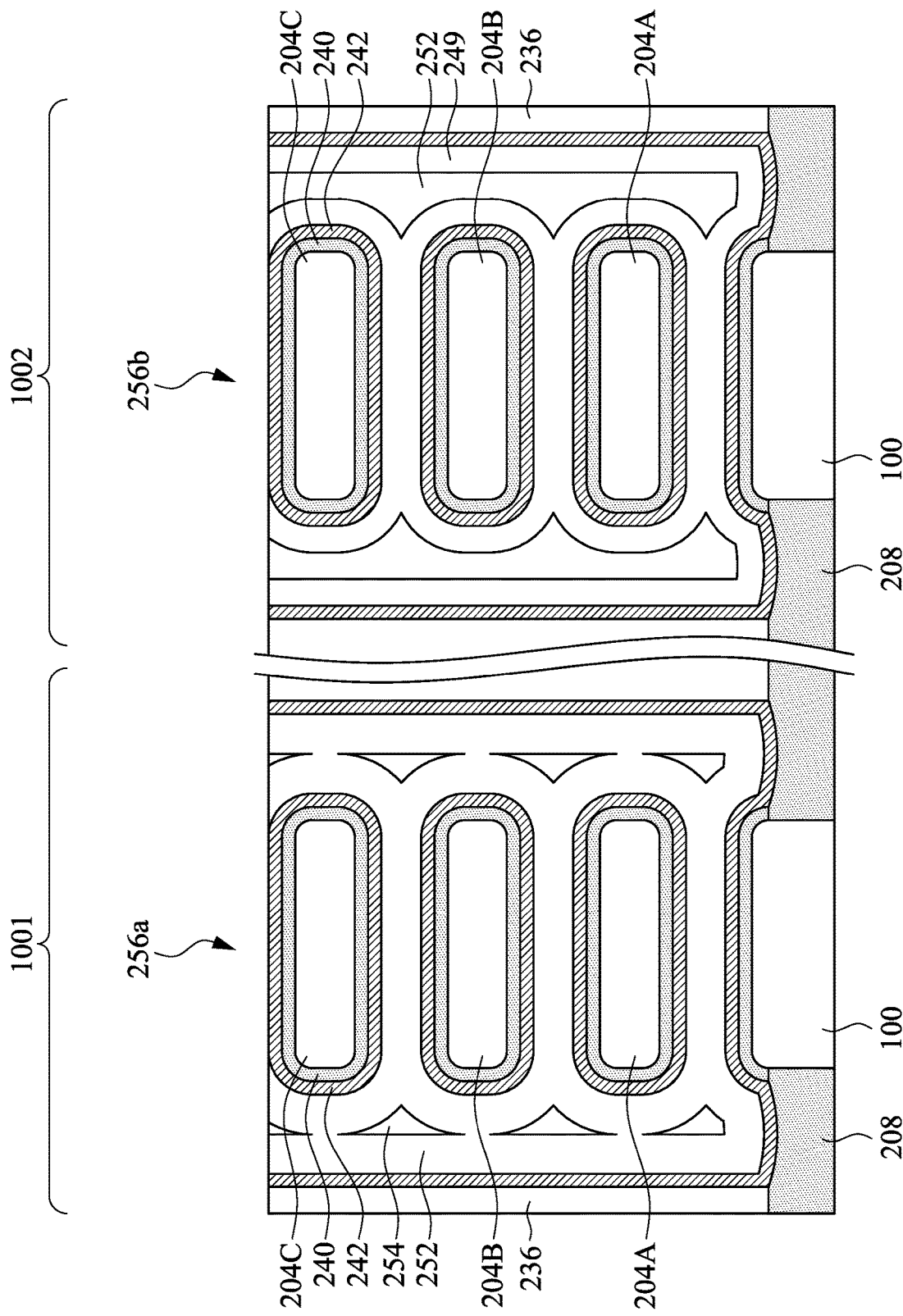

In FIG. 28, a fill metal 254 is formed on the one or more n-type work function metal layers 252 to fill a remainder of gate trenches. A CMP is then performed on the fill metal 254 until the ILD layer 236 is exposed, resulting in the one or more n-type work function metal layers 252, the one or more p-type work function metal layers 249, the gate dielectric layer 242 and the ILD layer 236 having substantially level top surfaces. The fill metal 254, the one or more n-type work function metal layers 252, and the corresponding gate dielectric layer 242 and interfacial layer 240 may be collectively referred to as a gate stack 256a. The one or more n-type work function metal layers 252, the one or more p-type work function metal layers 249, and the corresponding gate dielectric layer 242 and interfacial layer 240 may be collectively referred to as a gate stack 256b.

In some embodiments, the fill metal 254 may exemplarily include, but are not limited to, tungsten, aluminum, copper, nickel, cobalt, titanium, tantalum, titanium nitride, tantalum nitride, nickel silicide, cobalt silicide, TaC, TaSiN, TaCN, TiAl, TiAlN, or other suitable materials. Additional processing may be performed to finish fabrication of the device, as one of ordinary skill readily appreciates, thus details may not be repeated here. For example, another inter-layer dielectric (ILD) may be deposited over the ILD layer 236. Further, gate contacts and source/drain contacts may be formed extending through the additional ILD and/or the ILD layer 236 to electrically couple to the gate stacks 256a, 256b and the epitaxial source/drain regions 232 (see FIG. 15B), respectively.

Based on the above discussions, it can be seen that the present disclosure in various embodiments offers advantages. It is understood, however, that other embodiments may offer additional advantages, and not all advantages are necessarily disclosed herein, and that no particular advantage is required for all embodiments. One advantage is that by including fluorine in the gate dielectric layer and the interfacial layer, charge trapping and interfacial charge scattering can be reduced, which in turn may reduce oxide leakage current, improve threshold voltage stability and device performance. Another advantage is that in the absence of fluorine in the gate dielectric layer and the interfacial layer in the n-type device region, unwanted threshold voltage degradation of an NMOS device (increasing NMOS threshold voltage) may be prevented. Yet another advantage is that threshold voltages of the resulting devices in different device regions can be individually tuned.

In some embodiments, a method of forming a semiconductor device includes forming a fin over a substrate, the fin comprising alternately stacking first semiconductor layers and second semiconductor layers, removing the first semiconductor layers to form spaces each between the second semiconductor layers, forming a gate dielectric layer wrapping around each of the second semiconductor layers, forming a fluorine-containing layer on the gate dielectric layer, performing an anneal process to drive fluorine atoms from the fluorine-containing layer into the gate dielectric layer, removing the fluorine-containing layer, and forming a metal gate on the gate dielectric layer. In some embodiments, the fluorine-containing layer is formed using $WF_6$ and silane as precursors. In some embodiments, the fluorine-containing layer is tungsten. In some embodiments, the method further includes forming a barrier layer on the gate dielectric layer prior to forming the fluorine-containing layer, wherein the barrier layer comprises TiN, TaN, or Titanium Silicon Nitride (TSN). In some embodiments, the method further includes removing the barrier layer after the anneal process. In some embodiments, removing the fluorine-containing layer comprises using a wet etch using HCl, $H_2O_2$, $H_2O$, a combination thereof. In some embodiments, the method further includes forming an interfacial layer wrapping around each of the second semiconductor layers prior to forming the gate dielectric layer, wherein the annealing process is performed such that the fluorine atoms in the fluorine-containing layer drives into the interfacial layer.

In some embodiments, a method of forming a semiconductor device includes forming a first fin and a second fin in a first device region and a second device region on a substrate, respectively, each of the first fin and the second fin comprises alternately stacked first semiconductor layers and second semiconductor layers, removing the first semiconductor layers to form spaces each between the second semiconductor layers, forming a gate dielectric layer wrapping around each of the second semiconductor layers, forming a fluorine diffusion barrier layer on the gate dielectric layer in the first device region, performing a thermal soaking process to the substrate using a fluorine-containing gas, performing an anneal process to the substrate after performing the thermal soaking process, removing the fluorine diffusion barrier layer, and forming a metal gate on the gate dielectric layer. In some embodiments, the fluorine-containing gas comprises $NF_3$, $WF_6$, or a combination thereof. In some embodiments, the method further includes prior to performing the thermal soaking process, forming a TiN layer on the fluorine diffusion barrier layer. In some embodiments, the method further includes after performing the anneal process, removing the TiN layer from the fluorine diffusion barrier layer. In some embodiments, the method further includes forming one or more first work function layers on the fluorine diffusion barrier layer in the first device region and on the gate dielectric layer in the second device region, and after forming the one or more first work function layers, removing the one or more first work function layers and the fluorine diffusion barrier layer in the first device region. In some embodiments, the one or more first work function layers include p-type work function metal. In some embodiments, the method further includes forming one or more second work function layers on the gate dielectric layer in the first device region and on the one or more first work function layers in the second device region. In some embodiments, the one or more second work function layers include n-type work function metal. In some embodiments, the gate dielectric layer is fluorine-free after the anneal process is completed. In some embodiments, the method further includes prior to forming the gate dielectric layer, forming an interfacial layer wrapping around the second semiconductor layers, wherein the interfacial layer is fluorine-free after the anneal process is completed.

In some embodiments, a semiconductor device includes first semiconductor channels extending in a first direction above a substrate and spaced apart in a second direction perpendicular to the substrate, a first gate dielectric layer wrapping around the first semiconductor channels, wherein the first gate dielectric layer comprises fluorine atoms, one or more work function metal layers on the first gate dielectric layer, wherein the first gate dielectric layer and the one or more work function metal layers are collectively referred to as a gate stack, and source/drain regions on opposite sides of the gate stack. In some embodiments, the semiconductor device further includes second semiconductor channels separated from the first semiconductor channels and extending in the first direction above the substrate and spaced apart in the second direction perpendicular to the substrate, and a second gate dielectric layer wrapping around the second semiconductor channels, wherein the second gate dielectric layer has a lower fluorine concentration than the first gate dielectric layer. In some embodiments, the semiconductor device further comprises an interfacial layer between the first semiconductor channels and the first gate dielectric layer, wherein the interfacial layer comprises fluorine atoms.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
   forming a fin over a substrate, the fin comprising alternately stacking first semiconductor layers and second semiconductor layers;
   removing the first semiconductor layers to form spaces each between the second semiconductor layers;
   forming a gate dielectric layer wrapping around each of the second semiconductor layers;
   forming a fluorine-containing layer on the gate dielectric layer;
   performing an anneal process to drive fluorine atoms from the fluorine-containing layer into the gate dielectric layer;
   removing the fluorine-containing layer; and
   forming a metal gate on the gate dielectric layer.

2. The method of claim 1, wherein the fluorine-containing layer is formed using $WF_6$ and silane as precursors.

3. The method of claim 1, wherein the fluorine-containing layer is tungsten.

4. The method of claim 1, further comprising:
   forming a barrier layer on the gate dielectric layer prior to forming the fluorine-containing layer, wherein the barrier layer comprises TiN, TaN, or Titanium Silicon Nitride (TSN).

5. The method of claim 4, further comprising:
   removing the barrier layer after the anneal process.

6. The method of claim 1, wherein removing the fluorine-containing layer comprises:
   using a wet etch using HCl, $H_2O_2$, $H_2O$, a combination thereof.

7. The method of claim 1, further comprising:
   forming an interfacial layer wrapping around each of the second semiconductor layers prior to forming the gate dielectric layer, wherein the annealing process is performed such that the fluorine atoms in the fluorine-containing layer drives into the interfacial layer.

8. A method of forming a semiconductor device, comprising:
   forming channel layers over a first device region and a second device region of a substrate;
   forming a gate dielectric layer wrapping around each of the channel layers;
   forming a fluorine-containing layer on the gate dielectric layer;
   performing an anneal process to drive fluorine atoms from the fluorine-containing layer into the gate dielectric layer;
   removing the fluorine-containing layer; and
   forming a metal gate on the gate dielectric layer, wherein forming the metal gate on the gate dielectric layer comprises:
      forming a p-type work function metal layer over the gate dielectric layer; and
      removing the p-type work function metal layer in the first device region while remaining the p-type work function metal layer in the second device region.

9. The method of claim 8, further comprising:
   prior to forming the fluorine-containing layer on the gate dielectric layer, forming a barrier layer over the channel layers.

10. The method of claim 9, wherein the barrier layer is TaN.

11. The method of claim 9, wherein the barrier layer is titanium nitride.

12. The method of claim 9, further comprising:
    after performing the anneal process, removing the barrier layer.

13. The method of claim 8, wherein forming the metal gate on the gate dielectric layer comprises:
    after removing the p-type work function metal layer, forming an n-type work function metal layer over the gate dielectric layer.

14. The method of claim 13, wherein the n-type work function metal layer wraps around the channel layers.

15. The method of claim 8, wherein the p-type work function metal layer is in contact with the gate dielectric layer in the second device region.

16. The method of claim 8, wherein forming the fluorine-containing layer over the gate dielectric layer comprises:
    using hexafluoride ($WF_6$) and silane ($SiH_4$) as precursors form a tungsten.

17. A method of forming a semiconductor device, comprising:
    forming nanosheets over a substrate;
    forming a gate dielectric layer wrapping around each of the nanosheets;
    forming a fluorine-containing layer over the gate dielectric layer;
    performing an anneal process to drive fluorine atoms from the fluorine-containing layer into the gate dielectric layer;

removing the fluorine-containing layer; and forming a metal gate on the gate dielectric layer.

18. The method of claim 17, further comprising:

prior to forming the fluorine-containing layer on the gate dielectric layer, forming a TaN layer or a Titanium Silicon Nitride (TSN) layer over the gate dielectric layer.

19. The method of claim 17, wherein the metal gate comprises an n-type work function metal.

20. The method of claim 19, wherein the n-type work function metal is in contact with the gate dielectric layer.

* * * * *